(12) United States Patent
Goo et al.

(10) Patent No.: US 12,315,763 B2
(45) Date of Patent: May 27, 2025

(54) THREE-DIMENSIONAL MEMORY DEVICE AND METHOD OF MAKING THEREOF USING SACRIFICIAL CARBON-CONTAINING BARRIER FILM

(71) Applicant: Samsung Electronics Co., Ltd., Suwon-si (KR)

(72) Inventors: Younghoon Goo, Busan (KR); Dongyoung Kim, Pohang-si (KR); Kyungtae Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 506 days.

(21) Appl. No.: 17/817,077

(22) Filed: Aug. 3, 2022

(65) Prior Publication Data

US 2023/0207388 A1   Jun. 29, 2023

(30) Foreign Application Priority Data

Dec. 24, 2021   (KR) .................. 10-2021-0187771

(51) Int. Cl.
*H01L 21/768*   (2006.01)
*H10B 43/27*   (2023.01)
*H10B 43/35*   (2023.01)
*H10B 43/50*   (2023.01)

(52) U.S. Cl.
CPC .. *H01L 21/76843* (2013.01); *H01L 21/76804* (2013.01); *H01L 21/76861* (2013.01); *H01L 21/76877* (2013.01); *H10B 43/27* (2023.02); *H10B 43/35* (2023.02); *H10B 43/50* (2023.02)

(58) Field of Classification Search
CPC ............... H01L 23/544; H01L 23/5226; H01L 2221/1063
See application file for complete search history.

(56) References Cited

U.S. PATENT DOCUMENTS

| | | |
|---|---|---|
| 7,994,040 B2 | 8/2011 | Chi et al. |
| 8,536,652 B2 | 9/2013 | Lee et al. |
| 9,111,746 B2 | 8/2015 | Ranjan et al. |
| 9,418,889 B2 | 8/2016 | Mountsier et al. |
| 9,443,956 B2 | 9/2016 | Yu et al. |
| 9,893,171 B2 | 2/2018 | Basker et al. |
| 10,411,119 B2 | 9/2019 | Lee et al. |
| 10,971,600 B2 | 4/2021 | Clendenning et al. |

(Continued)

FOREIGN PATENT DOCUMENTS

KR   100370160 B1   1/2003

*Primary Examiner* — Alia Sabur
*Assistant Examiner* — Emily Nicole Farmer
(74) *Attorney, Agent, or Firm* — Myers Bigel, P.A.

(57) ABSTRACT

To manufacture a semiconductor device, a structure is formed by alternately stacking a plurality of first films and a plurality of second films one-by-one on a substrate. A vertical hole is formed to vertically pass through the structure. A carbon-containing barrier film is formed to conformally cover an inner sidewall of the vertical hole. The carbon-containing barrier film is in contact with portions of the plurality of first films and the plurality of second films. A sacrificial metal film is formed on the carbon-containing barrier film in the vertical hole. The sacrificial metal film is removed to expose the carbon-containing barrier film. The carbon-containing barrier film is removed using an ashing process.

20 Claims, 39 Drawing Sheets

(56) References Cited

U.S. PATENT DOCUMENTS

| | | |
|---|---|---|
| 11,063,119 B2 | 7/2021 | Wang |
| 11,075,115 B2 | 7/2021 | Chandrashekar et al. |
| 2015/0079743 A1* | 3/2015 | Pachamuthu .......... H10B 41/20 |
| | | 438/268 |
| 2019/0252396 A1* | 8/2019 | Mushiga ................ H10B 43/50 |
| 2020/0075627 A1* | 3/2020 | Ahn ....................... H10B 43/35 |
| 2020/0279745 A1 | 9/2020 | Cheng |
| 2021/0035857 A1 | 2/2021 | Zhou |
| 2021/0249261 A1 | 8/2021 | Hopkins et al. |

* cited by examiner

THREE-DIMENSIONAL MEMORY DEVICE AND METHOD OF MAKING THEREOF USING SACRIFICIAL CARBON-CONTAINING BARRIER FILM

CROSS-REFERENCE TO RELATED APPLICATION

This application is based on and claims priority under 35 U.S.C. § 119 to Korean Patent Application No. 10-2021-0187771, filed on Dec. 24, 2021, in the Korean Intellectual Property Office, the disclosure of which is incorporated by reference herein in its entirety.

BACKGROUND

The inventive concept relates to a method of manufacturing a semiconductor device, and more particularly, to a method of manufacturing a semiconductor device including a non-volatile vertical memory device.

An electronic system that needs to store data requires a semiconductor device capable of storing mass data. Therefore, research into methods of increasing the data storage capacity of semiconductor devices is being performed. For example, as one of the techniques for increasing the data storage capacity of semiconductor devices, a semiconductor device including a vertical memory device having three-dimensionally arranged memory cells instead of two-dimensionally arranged memory cells has been proposed.

SUMMARY

The inventive concept provides a method of manufacturing a semiconductor device, which includes memory cells arranged three-dimensionally. In the method, the stacked number of word lines is increased to improve the integration density of the semiconductor device. Therefore, even when an aspect ratio of a vertical hole passing through the word lines is increased, the semiconductor device may maintain desired electrical properties and reliability.

According to an aspect of the inventive concept, there is provided a method of manufacturing a method of manufacturing a semiconductor device. The method includes forming a structure by alternately stacking a plurality of first films and a plurality of second films on a substrate. A vertical hole is formed extending vertically through the structure. A carbon-containing barrier film is formed on an inner sidewall of the vertical hole such that the carbon-containing barrier film is in contact with portions of the plurality of first films and the plurality of second films. A sacrificial metal film in the vertical hole is formed on the carbon-containing barrier film. The sacrificial metal film is removed to expose the carbon-containing barrier film. The carbon-containing barrier film is removed using an ashing process.

According to another aspect of the inventive concept, there is provided a method of manufacturing a semiconductor device. The method includes providing a substrate. The substrate includes a first region having a plurality of chips thereon and a second region surrounding the first region. A first structure is formed in the first region on the substrate. The first structure is formed by alternately stacking a plurality of first films and a plurality of second films on the substrate. A second structure is formed in the second region on the substrate. A vertical hole is formed extending vertically through the first structure in the first region, and a recess region and a key hole are formed in the second structure in the second region. A carbon-containing barrier film including a first portion and a second portion is formed. The first portion is on an inner sidewall of the vertical hole in the first region to be in contact with portions of the plurality of first films and the plurality of second films. The second portion is on an inner surface of the recess region in the second region. A sacrificial metal film is formed simultaneously with an alignment metal film. The sacrificial metal film is in the vertical hole on the first portion of the carbon-containing barrier film in the first region, and the alignment metal film is on the second portion of the carbon-containing barrier film in the second region. The sacrificial metal film is removed from the first region to expose the first portion of the carbon-containing barrier film. The first portion of the carbon-containing barrier film is removed from the first region with an ashing process.

According to another aspect of the inventive concept, there is provided a method of manufacturing a semiconductor device. The method includes forming a lower structure by alternately stacking a plurality of silicon oxide films and a plurality of sacrificial insulating films in a chip region on a substrate. A lower vertical hole is formed that extends vertically through the lower structure. A first carbon-containing barrier film is formed on an inner sidewall of the lower vertical hole such that the first carbon-containing barrier film is in contact with portions of the plurality of silicon oxide films and the plurality of sacrificial insulating films. A sacrificial metal film is formed contacting the first carbon-containing barrier film and in the lower vertical hole on the first carbon-containing barrier film. A second carbon-containing barrier film is formed in an entrance space of the lower vertical hole on the first carbon-containing barrier film and the sacrificial metal film. An upper structure is formed on the lower structure. The upper structure has an upper vertical hole exposing the second carbon-containing barrier film. The second carbon-containing barrier film is removed through the upper vertical hole with an ashing process. The sacrificial metal film is removed through the upper vertical hole to expose the first carbon-containing barrier film. The first carbon-containing barrier film is removed through the upper vertical hole with an ashing process. A channel structure is formed inside the lower vertical hole and the upper vertical hole. The plurality of sacrificial insulating films is replaced with a plurality of gate lines.

BRIEF DESCRIPTION OF THE DRAWINGS

Embodiments of the inventive concept will be more clearly understood from the following detailed description taken in conjunction with the accompanying drawings in which:

FIGS. 4 and 5A to 5D are detailed diagrams of components of a chip region of a semiconductor device, according to embodiments, wherein FIG. 4 is a plan view of some components of a memory cell block of the chip region, FIG. 5A is a cross-sectional view taken along line Y1-Y1' of FIG. 4, FIG. 5B is a cross-sectional view taken along line X1-X1' of FIG. 4, FIG. 5C is an enlarged cross-sectional view taken along line X2-X2' of FIG. 4, and FIG. 5D is an enlarged cross-sectional view of some components in region "EX1" of FIG. 5A;

FIGS. 11A to 17C are cross-sectional views of a method of manufacturing a semiconductor device, according to embodiments, wherein FIGS. 11A, 14A, 15A, 16A, and 17A are cross-sectional views of some components of a portion corresponding to a cross-section taken along line Y1-Y1' of FIG. 4, according to a process sequence, FIGS. 11C, 12B, 13B, 14C, 15C, 16C, and 17C are cross-sectional views of some components of a portion corresponding to a cross-section taken long line X2-X2' of FIG. 4, according to the process sequence.

FIG. 20 illustrates a detailed configuration taken along line II-II' of FIG. 19.

DETAILED DESCRIPTION OF THE EMBODIMENTS

Figure 1:
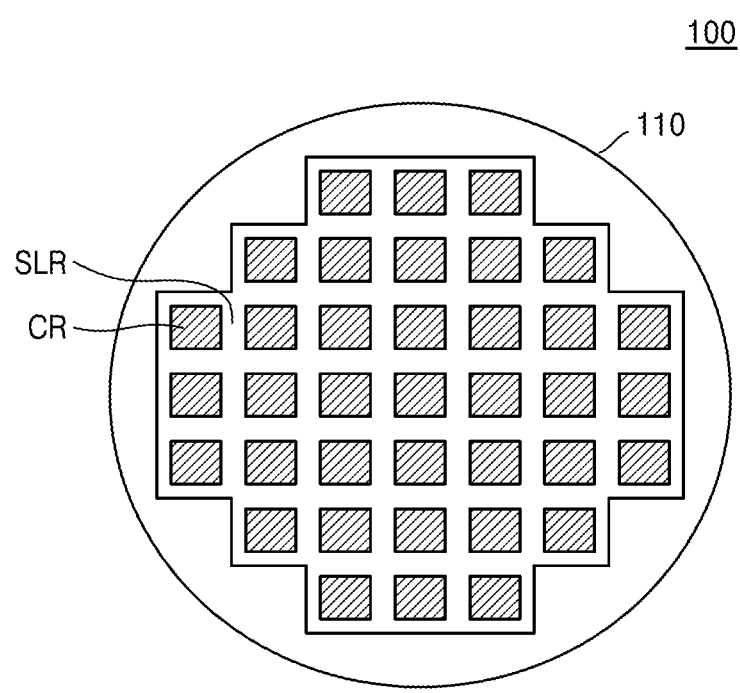
FIG. 1 is a plan view of a semiconductor device, which may be obtained using a method of manufacturing a semiconductor device, according to embodiments.

Hereinafter, embodiments will be described in detail with reference to the accompanying drawings. The same reference numerals are used to denote the same elements in the drawings, and repeated descriptions thereof are omitted.

FIG. 1 is a plan view of a semiconductor device 100, which may be obtained using a method of manufacturing a semiconductor device, according to embodiments.

Referring to FIG. 1, the semiconductor device 100 may include a substrate 110, which has a plurality of chip regions CR and a scribe lane region SLR configured to surround each of the chip regions CR. On the substrate 110, the plurality of chip regions CR may be arranged in a matrix form. The scribe lane region SLR may include a cutting region configured to individualize the plurality of chip regions CR.

Each of the plurality of chip regions CR may be a high-density region having a high pattern density, and the scribe lane region SLR may be a low-density region having a low pattern density. The plurality of chip regions CR may include a memory cell array region of the semiconductor device 100, a peripheral circuit region including circuits configured to be electrically connectable to memory cells included in the memory cell array region, and a core region.

In example embodiments, a non-volatile memory cell array, such as vertical NAND (VNAND) flash memory, may be formed in the memory cell array region. A plurality of patterns having a relatively small width may be apart from each other, regularly arranged in the memory cell array region, and repeatedly formed at a relatively small pitch.

Figure 2:
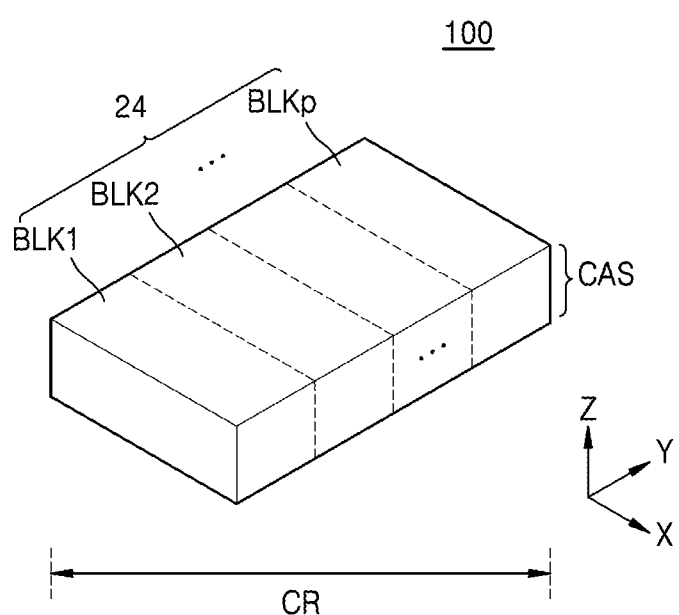
FIG. 2 is a perspective view of some components of a memory cell array region included in a chip region of a semiconductor device, according to embodiments.

FIG. 2 is a perspective view of some components of a memory cell array region included in each of the plurality of chip regions CR shown in FIG. 1.

Referring to FIG. 2, the chip region CR of the semiconductor device 100 may include a cell array structure CAS. The cell array structure CAS may include a plurality of tiles 24. Each of the plurality of tiles 24 may include a plurality of memory cell blocks BLK1, BLK2, . . . , and BLKp. Each of the plurality of memory cell blocks BLK1, BLK2, . . . , and BLKp may include memory cells arranged three-dimensionally.

Figure 3:
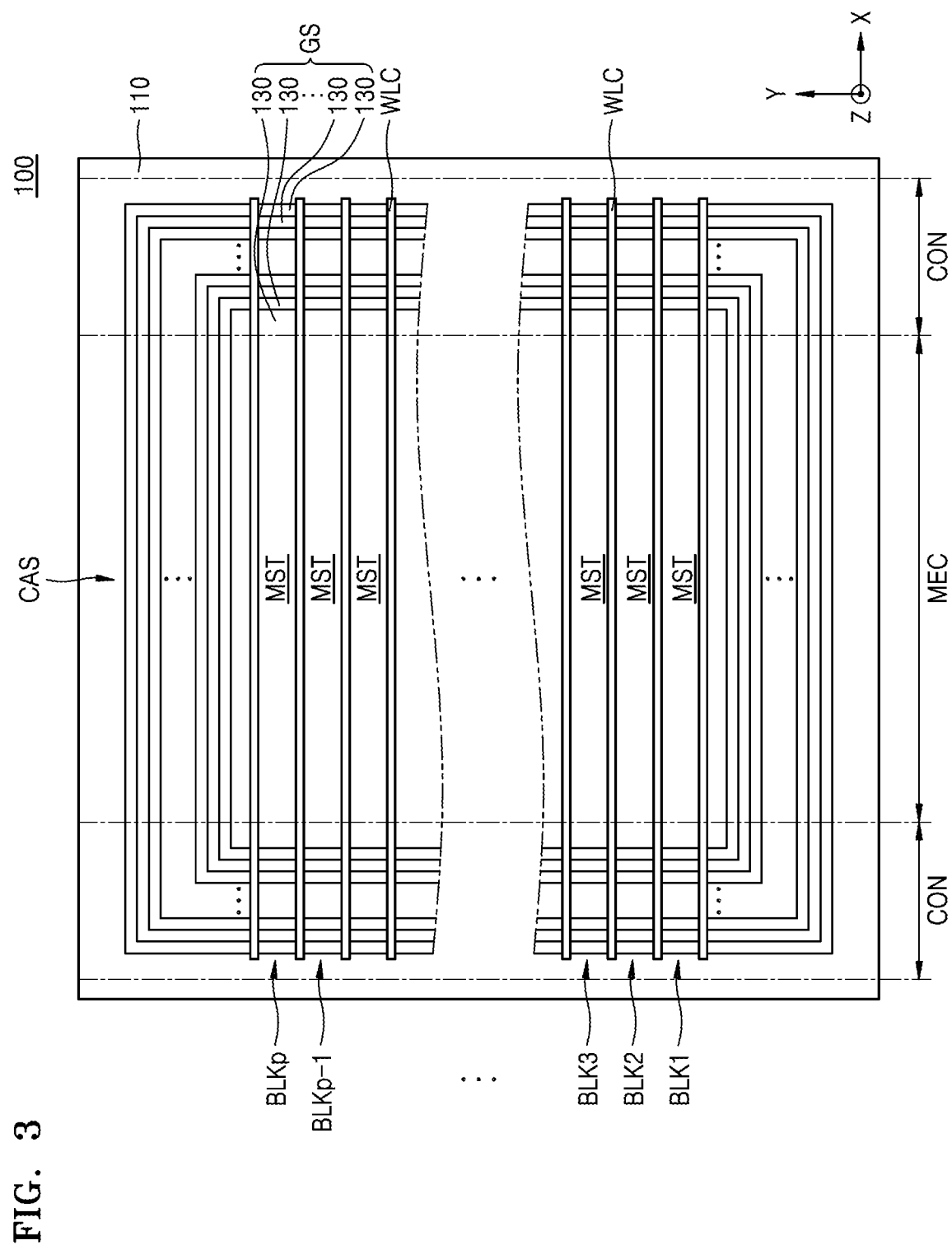
FIG. 3 is a plan view of a partial region of a chip region included in a semiconductor device according to embodiments.

FIG. 3 is a plan view of a partial region of a chip region CR included in a semiconductor device 100 according to embodiments.

Referring to FIG. 3, in the chip region CR, the cell array structure CAS may include a substrate 110 and a plurality of memory cell blocks BLK1, BLK2, . . . , BLKp−1, BLKp, which are on the substrate 110.

The cell array structure CAS may include a memory cell region MEC and connection regions CON on both sides of the memory cell region MEC in a first lateral direction (X direction). Each of the plurality of memory cell blocks BLK1, BLK2, . . . , BLKp−1, and BLKp may include a memory stack structure MST, which extends in the first lateral direction (X direction) over the memory cell region MEC and the connection region CON. The memory stack structure MST may include a plurality of gate lines 130, which are stacked in the memory cell region MEC and the connection region CON on the substrate 110 to overlap each other in a vertical direction (Z direction). In each of a plurality of memory stack structures MST, the plurality of gate lines 130 may constitute a gate stack GS. Each of the plurality of memory stack structures MST may include a plurality of memory stacks, which are at different vertical levels in the vertical direction (Z direction) and overlap each other in the vertical direction (Z direction). Each of the plurality of memory stacks may include a plurality of gate lines 130, which overlap each other in the vertical direction (Z direction). In example embodiments, each of the plurality of memory stacks may include 48, 64, or 96 gate lines 130, which are stacked to overlap each other in the vertical direction (Z direction), without being limited thereto.

In example embodiments, the plurality of gate lines 130 included in the plurality of memory stack structures MST may be gradually reduced in area on an X-Y plane in a direction away from the substrate 110. A central portion of each of the plurality of gate lines 130 overlapping each other in the vertical direction (Z direction) may constitute the memory cell region MEC, while an edge portion of each of the plurality of gate lines 130 may constitute the connection region CON.

On the substrate 110, a plurality of word line cut structures WLC may extend long in the first lateral direction (X direction) in the memory cell region MEC and the connection region CON. The plurality of word line cut structures WLC may be apart from each other in a second lateral direction (Y direction). The plurality of memory cell blocks BLK1, BLK2, . . . , BLKp−1, and BLKp may be respectively arranged one-by-one between the plurality of word line cut structures WLC.

Figure 4:
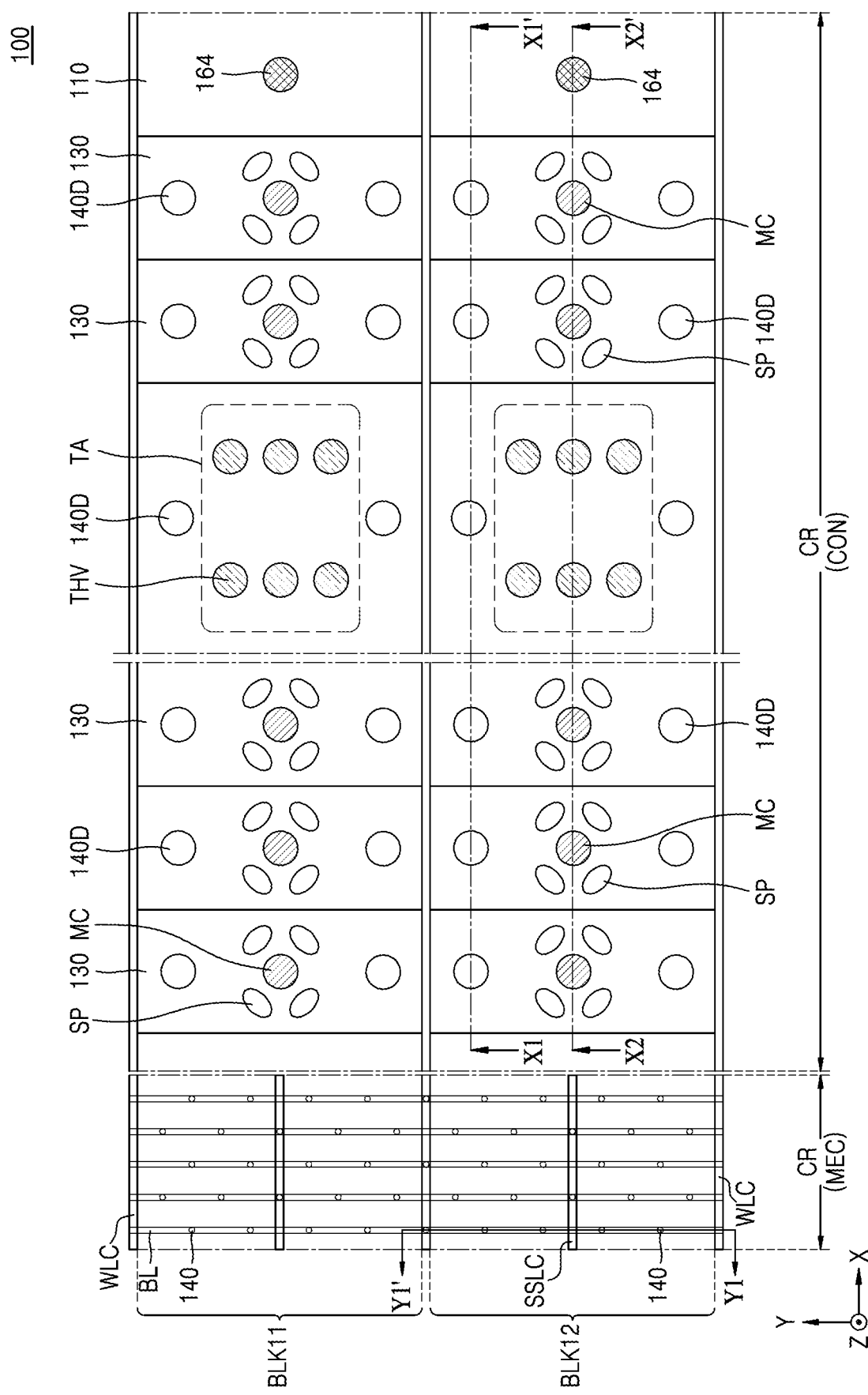
Figure 5A:
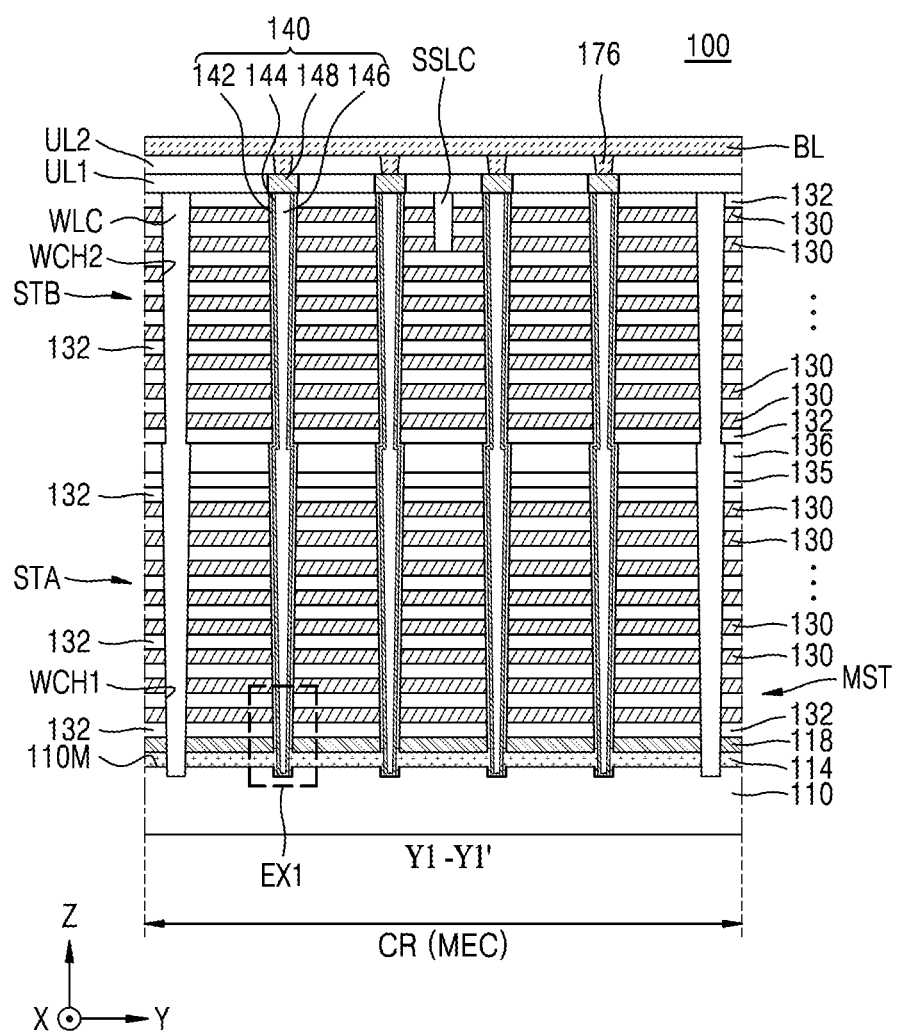
Figure 5B:
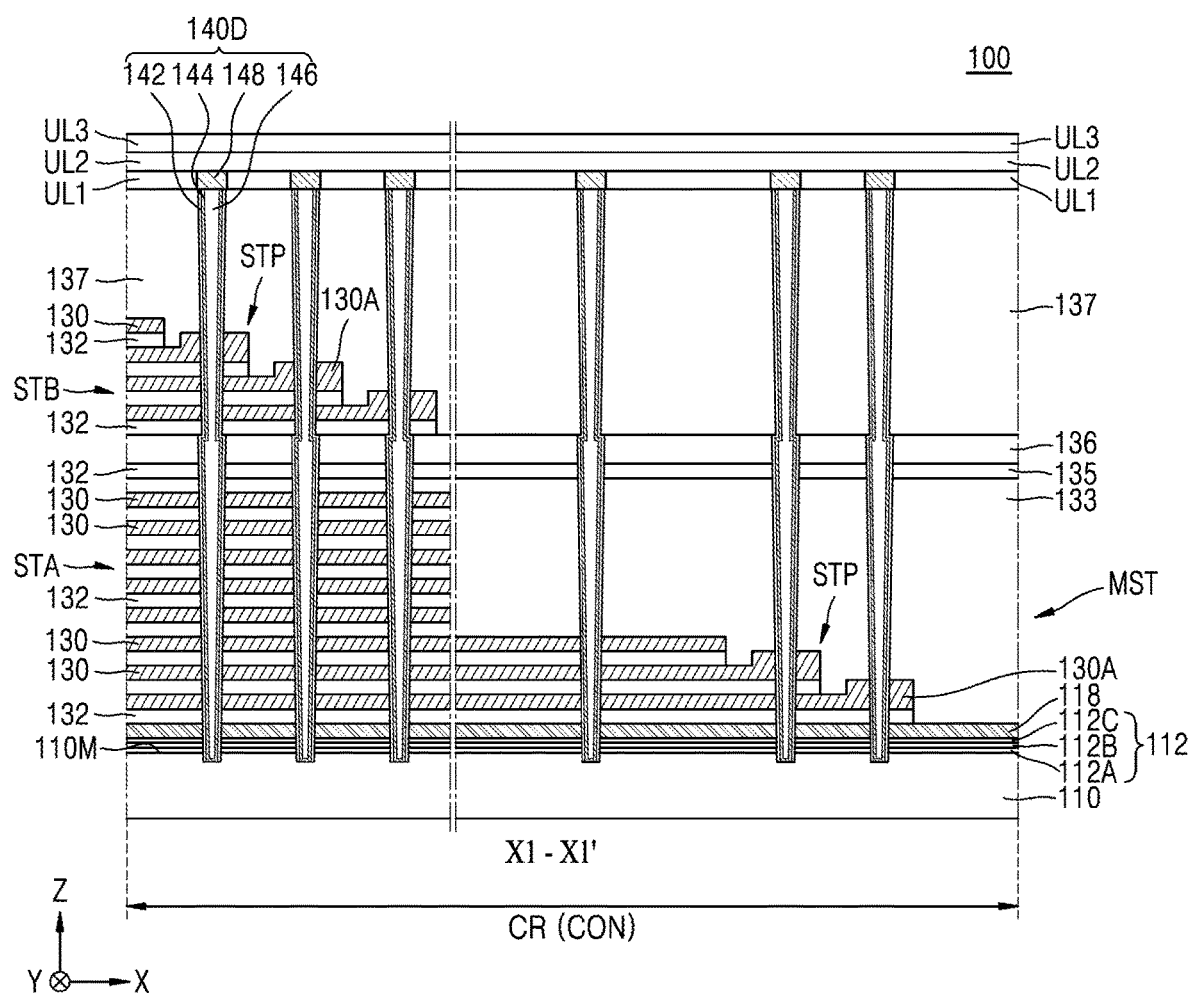
Figure 5C:
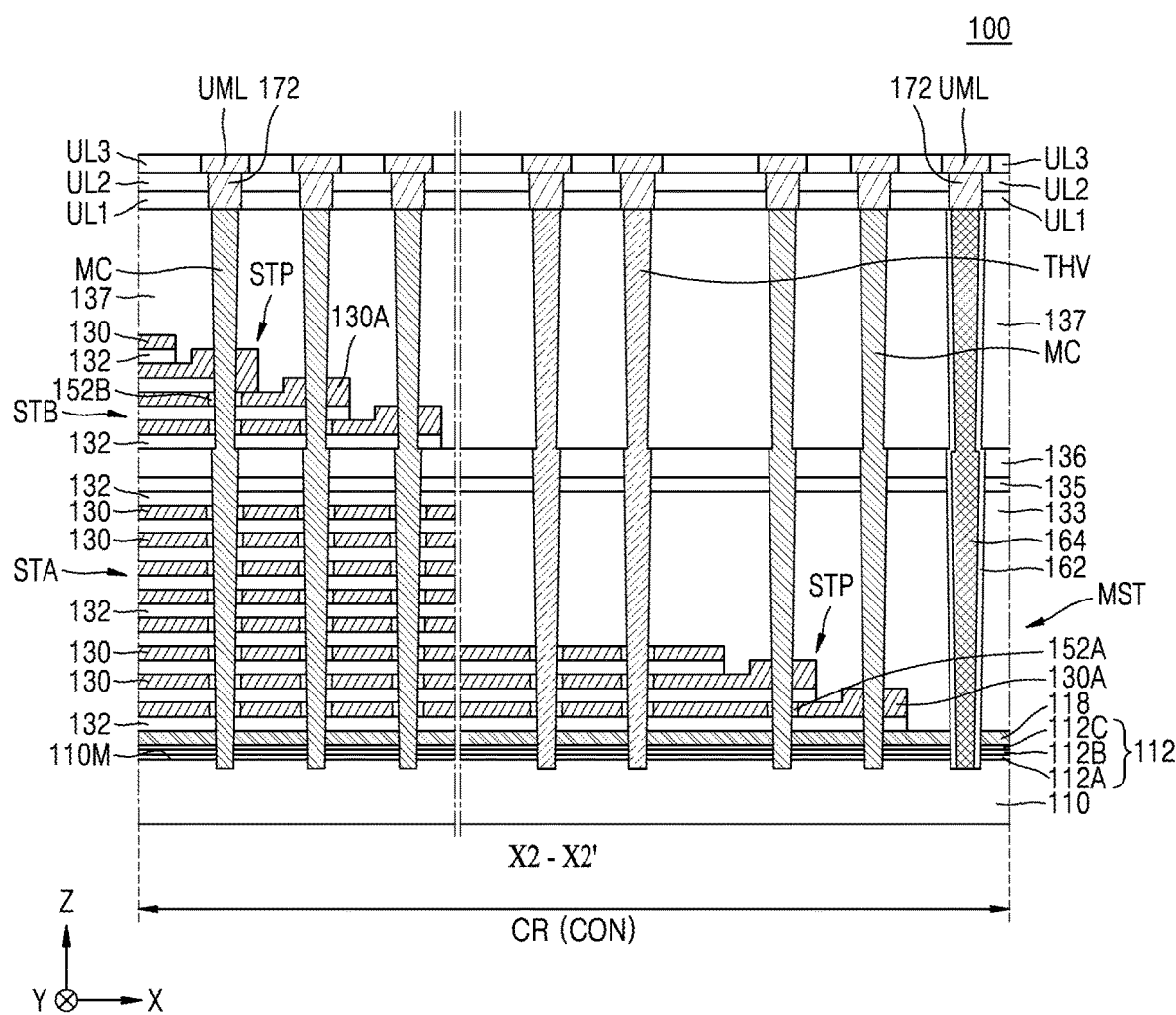
Figure 5D:
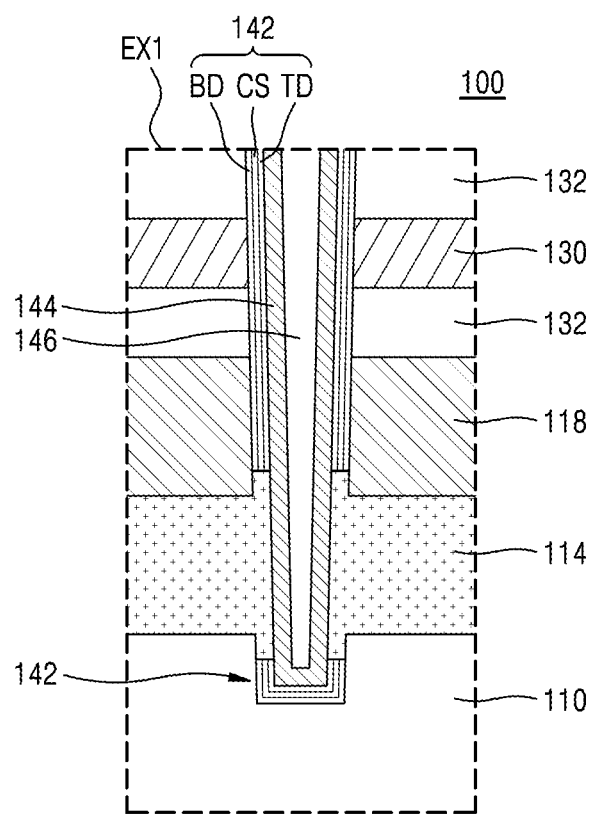

FIGS. 4 and 5A to 5D are detailed diagrams of components of a chip region CR of a semiconductor device 100 according to embodiments. More specifically, FIG. 4 is a plan view of some components of memory cell blocks BLK11 and BLK12 of the chip region CR. FIG. 5A is a cross-sectional view taken along line Y1-Y1' of FIG. 4. FIG. 5B is a cross-sectional view taken along line X1-X1' of FIG. 4. FIG. 5C is an enlarged cross-sectional view taken along line X2-X2' of FIG. 4. FIG. 5D is an enlarged cross-sectional view of some components included in region "EX1" of FIG. 5A. Each of the memory cell blocks BLK11 and BLK12 shown in FIG. 4 may constitute any one of the plurality of memory cell blocks BLK1, BLK2, BLK3, . . . , BLKp−1, and BLKp shown in FIG. 3.

Referring to FIGS. 4 and 5A to 5D, the chip region CR of the semiconductor device 100 may include a memory cell region MEC and a connection region CON on a substrate 110. In the memory cell region MEC and the connection region CON, a first stack STA may be on the substrate 110 at a first vertical level, and a second stack STB may be on the substrate 110 at a second vertical level. The second vertical level may be higher than the first vertical level. As used herein, the term "vertical level" refers to a distance from a top surface of the substrate 110 in a vertical direction (Z direction or −Z direction).

Each of the first stack STA and the second stack STB may include a stepped connection portion STP, which has a plurality of gate lines 130 and a plurality of conductive pad units 130A. The plurality of gate lines 130 may overlap each other in the vertical direction (Z direction) in the memory cell region MEC. The plurality of conductive pad units 130A may be in the connection region CON and integrally connected to the plurality of gate lines 130. The first stack STA and the second stack STB may constitute the cell array structure CAS shown in FIG. 3.

As shown in FIG. 5A, a first conductive plate 114 and a second conductive plate 118 may be on the substrate 110 in the memory cell region MEC. As shown in FIGS. 5B and 5C, an insulating plate 112 and the second conductive plate 118 may be on the substrate 110 in the connection region CON. In the memory cell region MEC and the connection region CON, a memory stack structure MST including the first stack STA and the second stack STB may be on the second conductive plate 118. In example embodiments, in the memory cell region MEC, the first conductive plate 114 and the second conductive plate 118 may serve as source regions configured to supply current to vertical memory cells included in the cell array structure CAS.

In example embodiments, the substrate 110 may include a semiconductor material, such as polysilicon. Each of the first conductive plate 114 and the second conductive plate 118 may include a doped polysilicon film, a metal film, or a combination thereof. The metal film may include tungsten (W), without being limited thereto. In the memory stack structure MST, the plurality of gate lines 130 may extend parallel to each other in a lateral direction and overlap each other in the vertical direction (Z direction). Each of the plurality of gate lines 130 may include a metal, a metal silicide, doped semiconductor, or a combination thereof. For example, each of the plurality of gate lines 130 may include a metal (e.g., tungsten, nickel, cobalt, and tantalum), a metal silicide (e.g., tungsten silicide, nickel silicide, cobalt silicide, and tantalum silicide), doped polysilicon, or a combination thereof.

An insulating film 132 may be between the second conductive plate 118 and the plurality of gate lines 130 and between the plurality of gate lines 130. In each of the first stack STA and the second stack STB, an uppermost one of the plurality of gate lines 130 may be covered by the insulating film 132. The insulating film 132 may include silicon oxide.

As shown in FIGS. 5B and 5C, in the connection region CON, an edge portion of each of the plurality of gate lines 130, the plurality of conductive pad units 130A, and a plurality of insulating films 132, which are in the first stack STA, may be covered by a lower insulating block 133. In the connection region CON, the edge portion of each of the plurality of gate lines 130, the plurality of conductive pad units 130A, and the plurality of insulating films 132, which are in the second stack STB, may be covered by an upper insulating block 137. Each of the lower insulating block 133 and the upper insulating block 137 may include a silicon oxide film.

A first middle insulating film 135 and a second middle insulating film 136 may be sequentially stacked on the first stack STA between the first stack STA and the second stack STB. Each of the first middle insulating film 135 and the second middle insulating film 136 may include a silicon oxide film.

As shown in FIGS. 4 and 5A, in the memory cell region MEC and the connection region CON, a plurality of word line cut structures WLC may extend long in a first lateral direction (X direction) on the substrate 110. A width of each of the plurality of gate lines 130 included in the memory cell blocks BLK11 and BLK12 in a second lateral direction (Y direction) may be defined by the plurality of word line cut structures WLC.

Each of the plurality of word line cut structures WLC may include an insulating structure. In example embodiments, the insulating structure may include silicon oxide, silicon nitride, silicon oxynitride, or a low-k dielectric material. For example, the insulating structure may include a silicon oxide film, a silicon nitride film, a silicon oxynitride (SiON) film, a silicon oxycarbonitride (SiOCN) film, a silicon carbonitride (SiCN) film, or a combination thereof. In other example embodiments, at least a portion of the insulating structure may include an air gap. As used herein, the term "air" refers to the atmosphere or other gases that may be present during a manufacturing process.

Between two adjacent word line cut structures WLC, the plurality of gate lines 130 may be stacked on the second conductive plate 118 to overlap each other in the vertical direction (Z direction). The plurality of gate lines 130 may include a ground selection line, a plurality of word lines, and a string selection line.

Two upper ones of the plurality of gate lines 130 may be apart from each other in the second lateral direction (Y direction) with a string selection line cut structure SSLC therebetween. The two gate lines 130, which are apart from each other with the string selection line cut structure SSLC therebetween, may each constitute the string selection line. Although FIG. 5A pertains to an example in which one string selection line cut structure SSLC is formed in one gate stack GS (refer to FIG. 3) that is defined by two adjacent string selection line cut structures SSLC, embodiments are not limited thereto. For example, at least two string selection line cut structures SSLC may be formed in one gate stack GS. The string selection line cut structure SSLC may be filled with an insulating film. In example embodiments, the string selection line cut structure SSLC may include an insulating film, which includes an oxide film, a nitride film, or a combination thereof. In example embodiments, at least a portion of the string selection line cut structure SSLC may include an air gap.

As shown in FIG. 5A, in the memory cell region MEC, a plurality of channel structures 140 may pass through the plurality of gate lines 130, the plurality of insulating films 132, the first middle insulating film 135, the second middle insulating film 136, the second conductive plate 118, and the first conductive plate 114 on the substrate 110 and extend in the vertical direction (Z direction). The plurality of channel structures 140 may be arranged a predetermined distance apart from each other in the first lateral direction (X direction) and the second lateral direction (Y direction). Each of the plurality of channel structures 140 may include a gate dielectric film 142, a channel region 144, a buried insulating film 146, and a drain region 148. As used herein, each of the plurality of channel structures 140 may be referred to as a plug structure.

As shown in FIG. 5D, the gate dielectric film 142 may include a tunneling dielectric film TD, a charge storage film CS, and a blocking dielectric film BD, which are sequentially formed from the channel region 144 toward the gate line 130. Relative thicknesses of the tunneling dielectric film TD, the charge storage film CS, and the blocking dielectric film BD are not limited to those shown in FIG. 5D and may be variously modified.

The tunneling dielectric film TD may include silicon oxide, hafnium oxide, aluminum oxide, zirconium oxide, and/or tantalum oxide. The charge storage film CS may be a region in which electrons that have passed through the tunneling dielectric film TD from the channel region 144 may be stored. The charge storage film CS may include silicon nitride, boron nitride, silicon boron nitride, or doped polysilicon. The blocking dielectric film BD may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

As shown in FIGS. 5A and 5D, the first conductive plate 114 may pass through a partial region of the gate dielectric film 142 in a lateral direction (X direction and/or Y direction) and be in contact with the channel region 144. A thickness (Z-directional size) of a portion of the first conductive plate 114, which vertically overlaps the gate dielectric film 142, may be greater than a thickness (Z-directional size) of a portion of the first conductive plate 114, which vertically overlaps the second conductive plate 118. The gate dielectric film 142 may include a portion covering a sidewall of the channel region 144 at a higher level than the first conductive plate 114 and a portion covering a bottom surface of the channel region 144 at a lower level than the first conductive plate 114. The channel region 144 may be apart from the substrate 110 with a lowermost portion of the gate dielectric film 142 therebetween. The sidewall of the channel region 144 may be in contact with the first conductive plate 114 and electrically connectable to the first conductive plate 114.

As shown in FIGS. 5A and 5D, the channel region 144 may have a cylindrical shape. The channel region 144 may include doped polysilicon or undoped polysilicon. The buried insulating film 146 may be in (or fill) an inner space of the channel region 144. The buried insulating film 146 may include an insulating material. For example, the buried insulating film 146 may include silicon oxide, silicon nitride, silicon oxynitride, or a combination thereof. In example embodiments the buried insulating film 146 may be omitted. In this case, the channel region 144 may have a hollow pillar structure.

As shown in FIG. 5A, a plurality of drain regions 148 may be insulated from each other by a first upper insulating film UL1 covering the second stack STB. The plurality of drain regions 148 may include a doped polysilicon film.

As shown in FIGS. 5A to 5C, in the memory cell region MEC and the connection region CON, a second upper insulating film UL2 and a third upper insulating film UL3 may be sequentially formed on the plurality of channel structures 140 and the first upper insulating film UL1. Each of the first upper insulating film UL1, the second upper insulating film UL2, and the third upper insulating film UL3 may include an oxide film, a nitride film, or a combination thereof.

As shown in FIGS. 4 and 5A, in the memory cell region MEC of the chip region CR, a plurality of bit lines BL may be on the second upper insulating film UL2 of the memory stack structure MST. The plurality of bit lines BL may extend parallel to each other in the second lateral direction (Y direction). The third upper insulating film UL3 (refer to FIGS. 5B and 5C) may be in or fill respective spaces between the plurality of bit lines BL. The drain region 148 of each of the plurality of channel structures 140 may be connected to the bit line BL through a contact plug 176 that passes through the second upper insulating film UL2.

As shown in FIGS. 5B and 5C, in the connection region CON of the chip region CR, an insulating plate 112 and a second conductive plate 118 may be sequentially stacked on the substrate 110. The insulating plate 112 may have a multilayered structure including a first insulating film 112A, a second insulating film 112B, and a third insulating film 112C, which are sequentially stacked on the substrate 110. In example embodiments, the first insulating film 112A and the third insulating film 112C may include a silicon oxide film, and the second insulating film 112B may include a silicon nitride film.

In the connection region CON, the conductive pad unit 130A may be formed at one end of each of the plurality of gate lines 130 included in the first stack STA and the second stack STB. The conductive pad unit 130A may have a greater thickness than the gate line 130 in the vertical direction (Z direction). The conductive pad unit 130A may be integrally connected to the edge portion of the gate line 130, which is farthest from the memory cell region MEC. Although FIGS. 5A and 5B illustrate only the conductive pad units 130A connected to the ends of some of the plurality of gate lines 130, other conductive pad units 130A, which are integrally connected to other gate lines 130, may be in a portion that is not shown in FIGS. 5B and 5C.

As shown in FIGS. 4 and 5C, a plurality of memory cell contacts MC and a plurality of insulating support structures SP may be in the connection region CON. Each of the plurality of memory cell contacts MC may be electrically connectable to a selected one of the plurality of conductive pad units 130A included in the first stack STA and the second stack STB. The plurality of insulating support structures SP may pass through the first stack STA and the second stack STB in the vertical direction (Z direction) to support the first stack STA and the second stack STB in the connection region CON. As used herein, each of the plurality of memory cell contacts MC and the plurality of insulating support structures SP may be referred to as a plug structure.

Some memory cell contacts MC, which are selected from among the plurality of memory cell contacts MC, may be apart from the stepped connection portion STP included in the second stack STB in a lateral direction (or X direction of FIG. 5A). The some memory cell contacts MC, which are selected from among the plurality of memory cell contacts MC, may pass through the stepped connection portion STP included in the first stack STA, the lower insulating block 133, the first middle insulating film 135, the second middle insulating film 136, and the upper insulating block 137 in the vertical direction (Z direction), and may be electrically connectable to a selected one of the plurality of conductive pad units 130A included in the first stack STA.

Some other memory cell contacts MC, which are selected from among the plurality of memory cell contacts MC, may each pass through the stepped connection portion STP of the second stack STB in the vertical direction (Z direction), and may be electrically connectable to a selected one of the plurality of conductive pad units 130A included in the second stack STB.

As shown in FIG. 5C, each of the plurality of memory cell contacts MC may pass through at least some of the plurality of gate lines 130 and the plurality of insulating films 132. Each of the plurality of memory cell contacts MC may be inside a hole passing through at least one of the plurality of gate lines 130.

Similar to the plurality of memory cell contacts MC, each of the plurality of insulating support structures SP (refer to FIG. 4) may pass through at least some of the plurality of gate lines 130 and the plurality of insulating films 132. Each of the plurality of insulating support structures SP may be inside a hole that passes through at least one of the plurality of gate lines 130.

Each of the plurality of memory cell contacts MC may be connected to a selected one of the plurality of gate lines 130 and may not be connected to other gate lines 130 except for the selected gate line 130. Each of the plurality of memory cell contacts MC may be in contact with the conductive pad unit 130A of a selected one of the plurality of gate lines 130 and may be connected to the selected gate line 130 through the conductive pad unit 130A.

In example embodiments, each of the plurality of memory cell contacts MC may include tungsten, titanium, tantalum, copper, aluminum, titanium nitride, tantalum nitride, tungsten nitride, or a combination thereof, without being limited thereto. Each of the plurality of insulating support structures SP may include silicon oxide, without being limited thereto.

Each of the plurality of memory cell contacts MC may be apart from other gate lines 130 except for the selected gate line 130 in a lateral direction. In the first stack STA, a first insulating ring 152A may be between each of the plurality of memory cell contacts MC and the gate line 130 that is not connected thereto. In the second stack STB, a second insulating ring 152B may be between each of the plurality of memory cell contacts MC and the gate line 130 that is not connected thereto. In example embodiments, the first insulating ring 152A and the second insulating ring 152B may include a silicon oxide film, without being limited thereto.

As shown in FIGS. 4 and 5B, a plurality of dummy channel structures 140D may be in the connection region CON. The plurality of dummy channel structures 140D may include a plurality of dummy channel structures 140D, which pass through the stepped connection portion STP of the first stack STA in the vertical direction (Z direction), and a plurality of dummy channel structures 140D, which pass through the stepped connection portion STP of each of the first stack STA and the second stack STB and the first and second middle insulating films 135 and 136 in the vertical direction (Z direction). Although FIG. 5B pertains to an example in which the plurality of dummy channel structures 140D pass through the conductive pad unit 130A included in the stepped connection portion STP in the vertical direction (Z direction), the inventive concept is not limited thereto. For example, in the connection region CON, at least some of the plurality of dummy channel structures 140D may pass through a portion of the gate line 130, which is apart from the conductive pad unit 130A in a lateral direction, in the vertical direction (Z direction). As used herein, each of the plurality of dummy channel structures 140D may be referred to as a plug structure.

Some dummy channel structures 140D selected from the plurality of dummy channel structures 140D may pass through the stepped connection portion STP included in the first stack STA, the lower insulating block 133, the first middle insulating film 135, the second middle insulating film 136, and the upper insulating block 137 in the vertical direction (Z direction). Some other dummy channel structures 140D selected from the plurality of dummy channel structures 140D may pass through the stepped connection portion STP included in the first stack STA, the first middle insulating film 135, the second middle insulating film 136, the stepped connection portion STP included in the second stack STB, and the upper insulating block 137 in the vertical direction (Z direction).

In the connection region CON, the plurality of dummy channel structures 140D may be arranged a predetermined distance apart from each other in the first lateral direction (X direction) and the second lateral direction (Y direction). Similar to the channel structure 140 in the memory cell region MEC, each of the plurality of dummy channel structures 140D may include a gate dielectric film 142, a channel region 144, a buried insulating film 146, and a drain region 148. However, a planar size of each of the plurality of dummy channel structures 140D may be greater than a planar size of the channel structure 140. The number and arrangement shape of dummy channel structures 140D shown in FIG. 4 are merely examples, but the inventive concept is not limited thereto. In the connection region CON, the plurality of dummy channel structures 140D may be variously arranged at various positions selected in the memory stack structure MST.

As shown in FIGS. 5B and 5C, in the connection region CON, the upper insulating block 137 may be covered by the first upper insulating film UL1. In the connection region CON, the plurality of dummy channel structures 140D may be covered by the second upper insulating film UL2.

As shown in FIGS. 4 and 5C, a conductive plate contact 164 may be in the connection region CON. The conductive plate contact 164 may pass through the upper insulating block 137, the first and second middle insulating films 135 and 136, the lower insulating block 133, the second conductive plate 118, and the insulating plate 112 and extend to the substrate 110 in the vertical direction (Z direction). Sidewalls of the conductive plate contact 164 may be covered by insulating spacers 162. The insulating spacers 162 may include a silicon oxide film.

Each of the plurality of memory cell contacts MC and the conductive plate contact 164 may be connected one of a plurality of upper wiring layers UML through a contact plug 172 that passes through the first upper insulating film UL1 and the second upper insulating film UL2. The plurality of upper wiring layers UML may be at the same vertical level as the plurality of bit lines BL that are in the memory cell region MEC. The third upper insulating film UL3 may be in or fill respective spaces between the plurality of upper wiring layers UML.

Respective uppermost surfaces of the plurality of memory cell contacts MC, the plurality of insulating support structures SP, and the conductive plate contact 164 may extend at substantially the same vertical level. In example embodiments, the conductive plate contact 164, a plurality of contact plugs 172, a plurality of contact plugs 176, the plurality of upper wiring layers UML, and the plurality of bit lines BL may each include tungsten, titanium, tantalum, copper, aluminum, titanium nitride, tantalum nitride, tungsten nitride, or a combination thereof, without being limited thereto.

As shown in FIGS. 4 and 5C, in the chip region CR of the semiconductor device 100, each of the memory cell blocks BLK11 and BLK12 may include a through electrode region TA, which includes a plurality of through electrodes THV in the connection region CON. As used herein, each of the plurality of through electrodes THV may be referred to as a plug structure.

Each of the plurality of through electrodes THV may pass through at least one of the stepped connection portion STP included in the first stack STA and the stepped connection portion STP included in the second stack STB in the vertical direction (Z direction). Each of the plurality of through electrodes THV may not be electrically connected to the gate lines 130 and the conductive pad units 130A, which are in the first stack STA and the second stack STB.

As shown in FIG. 5C, some through electrodes THV selected from the plurality of through electrodes THV may include portions surrounded by the lower insulating block 133, portions surrounded by the first and second middle insulating films 135 and 136, and portions surrounded by the upper insulating block 137. In the connection region CON, respective uppermost surfaces of the plurality of memory cell contacts MC, the plurality of through electrodes THV, and the conductive plate contact 164 may extend at substantially the same vertical level.

Each of the plurality of through electrodes THV may pass through at least some of the plurality of gate lines 130 and the plurality of insulating films 132. Each of the plurality of through electrodes THV may be inside a hole that passes through at least one of the plurality of gate lines 130. Each of the plurality of through electrodes THV may not be connected to the gate line 130. Each of the plurality of through electrodes THV may be apart from the gate line 130 in a lateral direction. Each of the plurality of through electrodes THV may include tungsten, titanium, tantalum, copper, aluminum, titanium nitride, tantalum nitride, tungsten nitride, or a combination thereof, without being limited thereto.

In the first stack STA, a first insulating ring 152A may be between the plurality of through electrodes THV and the gate line 130 adjacent thereto. When the plurality of through electrodes THV pass through the second stack STB, in the second stack STB, a second insulating ring 152B may be between the plurality of through electrodes THV and the gate line 130 adjacent thereto.

Figure 6:
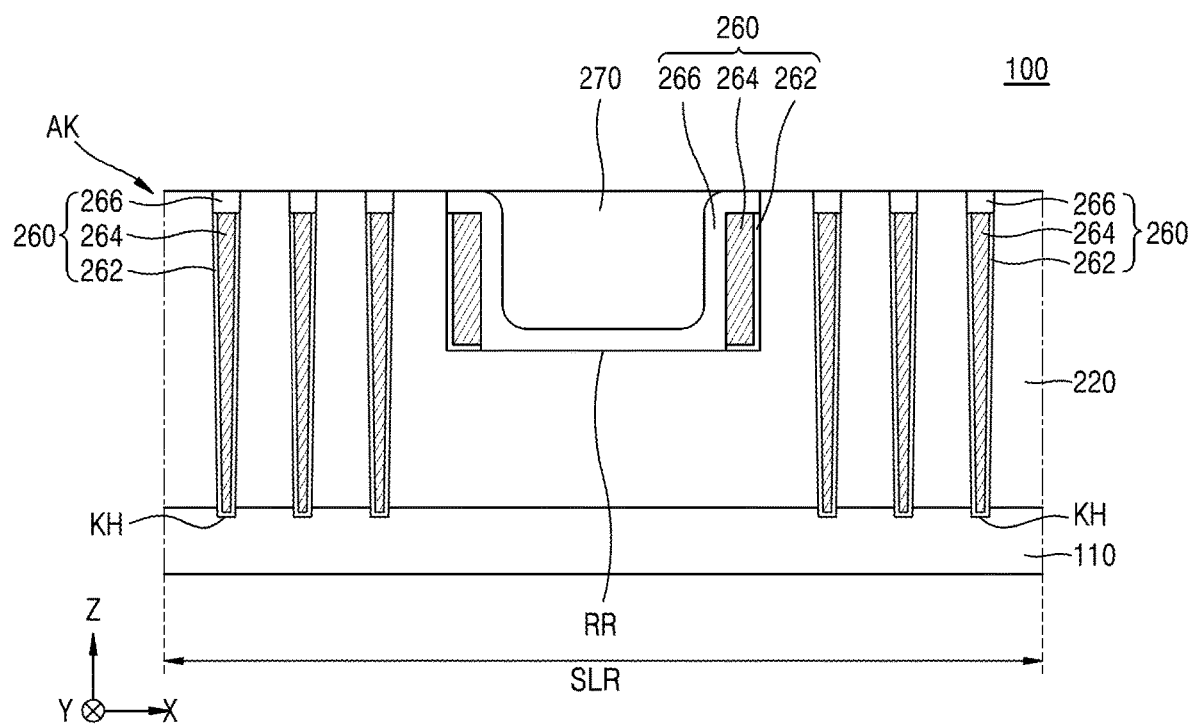
FIG. 6 is a cross-sectional view of some components of a scribe lane region of a semiconductor device according to embodiments.

FIG. 6 is a cross-sectional view of some components of the scribe lane region SLR (refer to FIG. 1) of a semiconductor device 100 according to embodiments.

Referring to FIG. 6, in the scribe lane region SLR of the semiconductor device 100, an insulating structure 220 may be on the substrate 110. A recess region RR and a plurality of key holes KH, which are required to form an alignment key AK, may be formed in a top surface of the insulating structure 220. In example embodiments, the insulating structure 220 may include the same material as a selected one of the lower insulating block 133, the first middle insulating film 135, the second middle insulating film 136, and the upper insulating block 137 in a chip region CR.

An alignment key structure 260 may be inside each of the recess region RR and the plurality of key holes KH. The alignment key structure 260 may constitute the alignment key AK.

In each of the recess region RR and the plurality of key holes KH, the alignment key structure 260 may include a first carbon-containing barrier film 262, an alignment metal film 264, and a second carbon-containing barrier film 266. In the recess region RR, the first carbon-containing barrier film 262 may be on (e.g., conformally cover) an inner sidewall of the recess region RR. In each of the plurality of key holes KH, the first carbon-containing barrier film 262 may be formed on (e.g., to conformally cover) an inner surface of each of the plurality of key holes KH. As used herein, the first carbon-containing barrier film 262 formed in the scribe lane region SLR may be referred to as an alignment barrier film. The first carbon-containing barrier film 262 may be in contact with the insulating structure 220 inside each of the recess region RR and the plurality of key holes KH. A bottom surface of the alignment metal film 264 may be in contact with the first carbon-containing barrier film 262 inside each of the recess region RR and the plurality of key holes KH. A portion of the second carbon-containing barrier film 266 inside the recess region RR may be on (e.g., conformally cover) a bottom surface of the recess region RR and a sidewall of the alignment metal film 264. Portions of the second carbon-containing barrier film 266, which are inside the plurality of key holes KH, may be in (or fill) respective entrance spaces of the plurality of key holes KH on the first carbon-containing barrier film 262 and the alignment metal film 264.

The first carbon-containing barrier film 262 and the second carbon-containing barrier film 266 may include carbon atoms and nitrogen atoms. In example embodiments, each of the first carbon-containing barrier film 262 and the second carbon-containing barrier film 266 may include a boron carbonitride (BCN) thin film. In other example embodiments, each of the first carbon-containing barrier film 262 and the second carbon-containing barrier film 266 may include silicon carbonitride (SiCN), silicon oxycarbonitride (SiOCN), silicon boron carbonitride (SiBCN), or a combination thereof. As used herein, each of the terms "BCN," "SiCN," "SiOCN," and "SiBCN" refers to a material including elements included therein, without referring to a chemical formula representing a stoichiometric relationship.

In example embodiments, the first carbon-containing barrier film 262 and the second carbon-containing barrier film 266 may have a hexagonal BCN (h-BCN) structure in which carbon atoms, boron atoms, and nitrogen atoms are regularly arranged. In other example embodiments, the first carbon-containing barrier film 262 and the second carbon-containing barrier film 266 may include at least 30 atomic percent (at %) of carbon atoms. For example, a content of carbon atoms in the first carbon-containing barrier film 262 and the second carbon-containing barrier film 266 may be in a range of about 30 at % to about 60 at %, without being limited thereto.

In example embodiments, the alignment metal film 264 may include tungsten (W). An insulating film 270 may be in or fill a space on the alignment metal film 264 inside the recess region RR. The insulating film 270 may include a silicon nitride film, a silicon oxide film, or a combination thereof.

The alignment key AK including the alignment key structure 260 shown in FIG. 6 may be formed simultaneously with the formation of a sacrificial structure (e.g., a lower sacrificial structure S1 shown in FIGS. 14A to 14C) during a process of forming a plug structure (e.g., at least one plug structure selected from the plurality of channel structures 140, the plurality of memory cell contacts MC, the plurality of insulating support structures SP, the plurality of dummy channel structures 140D, and the plurality of through electrodes THV), which is in the chip region CR of the semiconductor device 100. The sacrificial structure may be formed in or to fill the inside of a vertical hole required to form the at least one plug structure.

Figure 7A:
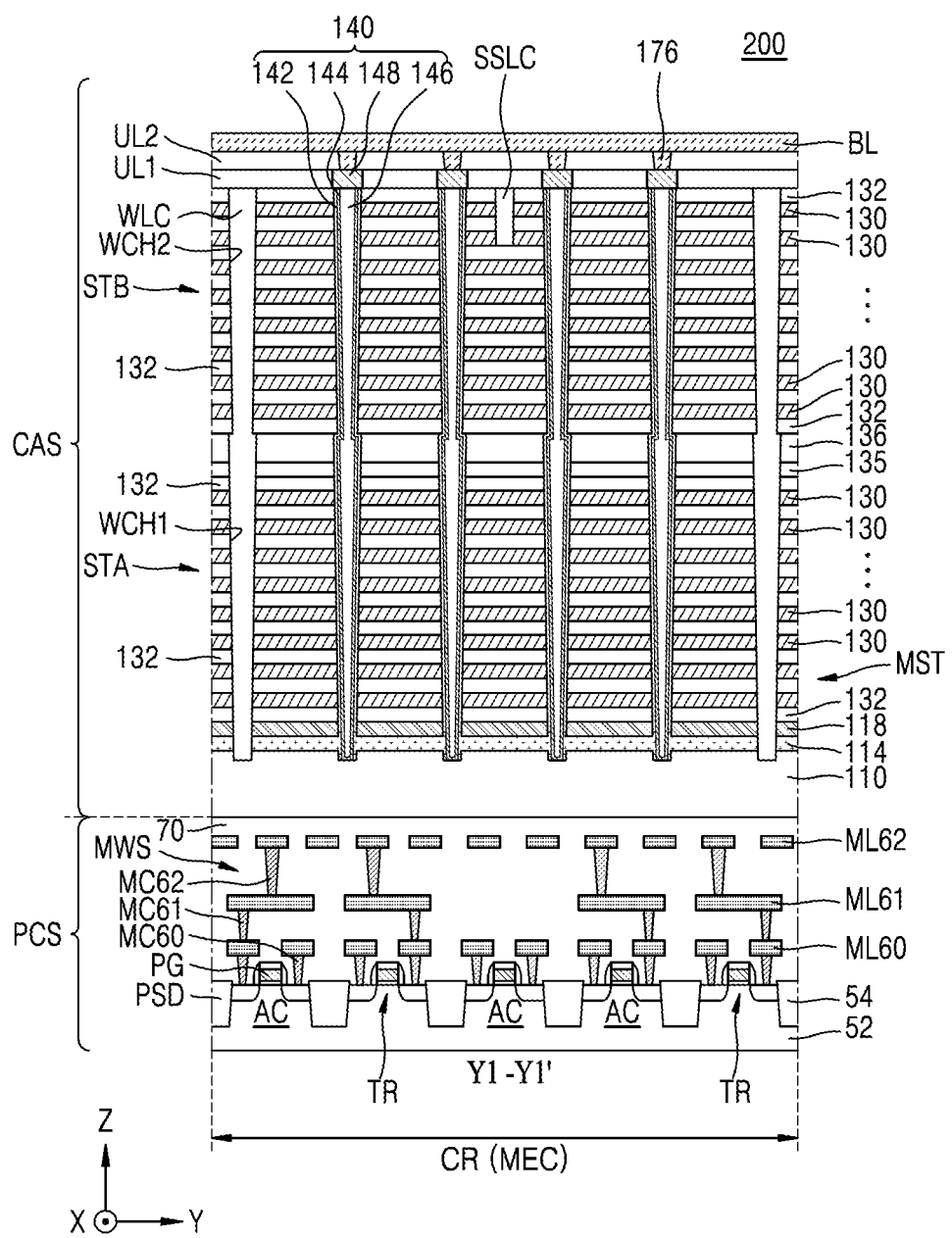
FIGS. 7A, 7B, and 7C are cross-sectional views of configurations of a chip region of a semiconductor device, according to example embodiments.
Figure 7B:
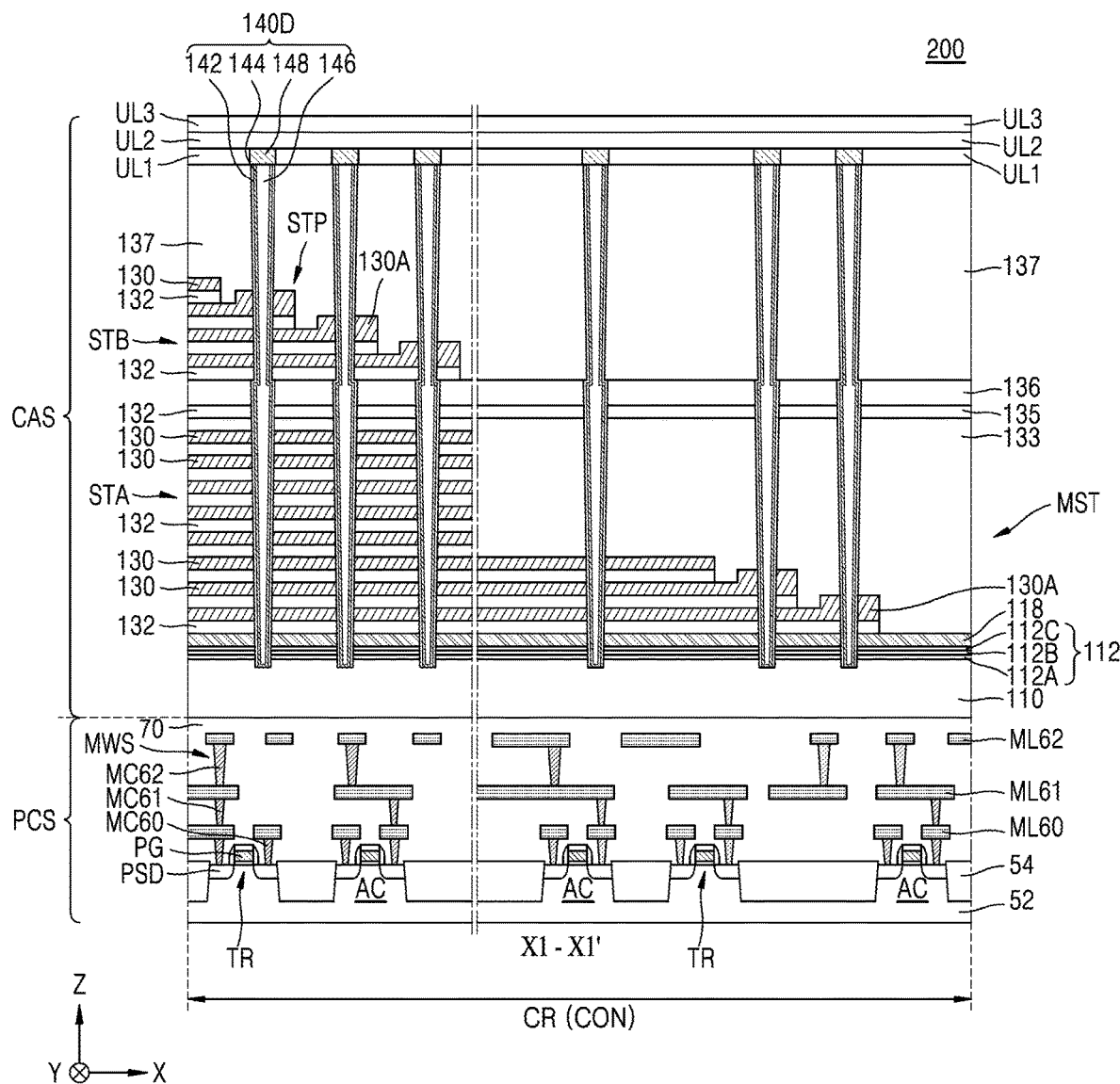
Figure 7C:
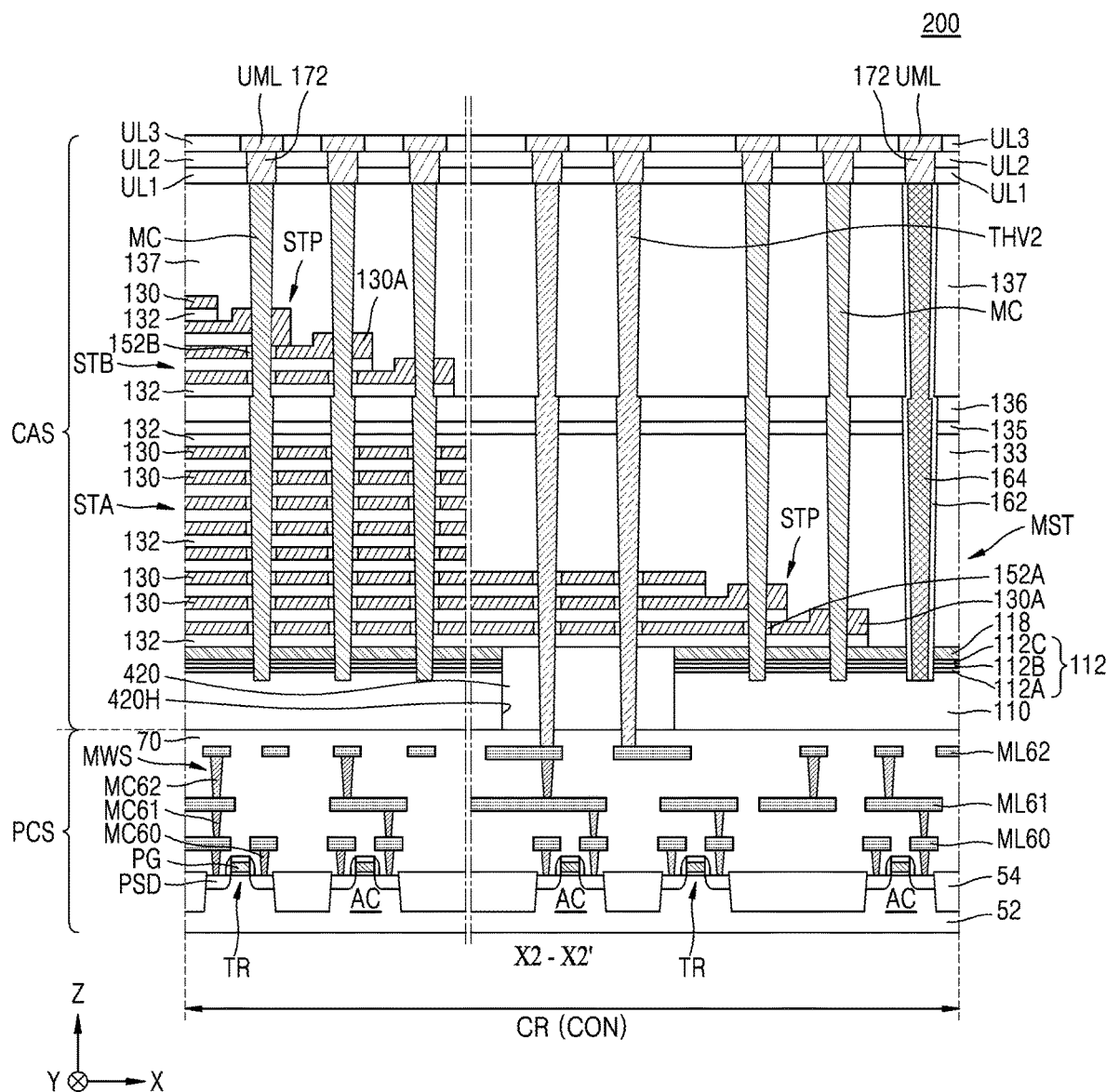

FIGS. 7A, 7B, and 7C are cross-sectional views of configurations of a chip region CR of a semiconductor device 200, according to example embodiments. FIG. 7A illustrates some components of a portion corresponding to a cross-section taken along line Y1-Y1' of FIG. 4. FIG. 7B illustrates some components of a portion corresponding to a cross-section taken along line X1-X1' of FIG. 4. FIG. 7C illustrates some components of a portion corresponding to a cross-section taken along line X2-X2' of FIG. 4. In FIGS. 7A, 7B, and 7C, the same reference numerals are used to denote the same elements as in FIGS. 1 to 6, and detailed descriptions thereof are omitted.

Referring to FIGS. 7A, 7B, and 7C, the chip region CR of the semiconductor device 200 may have substantially the same configuration as the semiconductor device 100 described with reference to FIGS. 1 to 6. However, the chip region CR of the semiconductor device 200 may include a cell array structure CAS and a peripheral circuit structure PCS, which overlap each other in a vertical direction (Z direction). The cell array structure CAS may include the memory stack structure MST described with reference to FIGS. 3 and 5A to 5C. The memory stack structure MST of the cell array structure CAS may have substantially the same configuration as that described with reference to FIGS. 4 and 5A to 5D.

The peripheral circuit structure PCS may include a lower substrate 52, a plurality of peripheral circuits formed on the lower substrate 52, and a multilayered wiring structure MWS configured to connect the plurality of peripheral circuits to each other or connect the plurality of peripheral circuits to components in the memory cell region MEC.

The lower substrate 52 may include a semiconductor substrate. For example, the lower substrate 52 may include silicon (Si), germanium (Ge), or silicon germanium (SiGe). An active region AC may be defined by a device isolation film 54 in the lower substrate 52. A plurality of transistors TR, which constitute the plurality of peripheral circuits, may be formed in the active region AC. Each of the plurality of transistors TR may include a gate PG and a plurality of ion implantation regions PSD, which are formed on both sides of the gate PG in the active region AC. Each of the plurality of ion implantation regions PSD may constitute a source region or a drain region of the transistor TR.

In example embodiments, the plurality of peripheral circuits included in the peripheral circuit structure PCS may include a row decoder, a page buffer, a data input/output (I/O) circuit, a control logic, and a common source line driver, without being limited thereto.

The multilayered wiring structure MWS in the peripheral circuit structure PCS may include a plurality of peripheral circuit wiring layers (e.g., ML60, ML61, and ML62) and a plurality of peripheral circuit contacts (e.g., MC60, MC61, and MC62). At least some of the plurality of peripheral circuit wiring layers (e.g., ML60, ML61, and ML62) may be electrically connectable to the transistor TR. The plurality of peripheral circuit contacts (e.g., MC60, MC61, and MC62) may connect the plurality of transistors TR to some selected from the plurality of peripheral circuit wiring layers (e.g., ML60, ML61, and ML62).

FIGS. 7A to 7C pertain to an example in which the multilayered wiring structure MWS has a triple wiring layer in the vertical direction (Z direction), but the inventive concept is not limited thereto. For example, the multilayered wiring structure MWS may include two wiring layers or four or more wiring layers.

The plurality of peripheral circuit wiring layers (e.g., ML60, ML61, and ML62) and the plurality of peripheral circuit contacts (e.g., MC60, MC61, and MC62) may each include a metal, a conductive metal nitride, a metal silicide, or a combination thereof. For example, the plurality of peripheral circuit wiring layers (e.g., ML60, ML61, and ML62) and the plurality of peripheral circuit contacts (e.g., MC60, MC61, and MC62) may each include a conductive material, such as tungsten, molybdenum, titanium, cobalt, tantalum, nickel, tungsten silicide, titanium silicide, cobalt silicide, tantalum silicide, or nickel silicide.

The plurality of transistors TR and the multilayered wiring structure MWS in the peripheral circuit structure PCS may be covered by an interlayer insulating film 70. The interlayer insulating film 70 may include silicon oxide, SiON, and/or SiOCN.

As shown in FIG. 7A, in the memory cell region MEC of the cell array structure CAS, a substrate 110 may be on the peripheral circuit structure PCS, and a first conductive plate 114, a second conductive plate 118, a first stack STA, and a second stack STB may be sequentially stacked on the substrate 110.

As shown in FIGS. 7B and 7C, in the connection region CON of the cell array structure CAS, the substrate 110 may be on the peripheral circuit structure PCS, and an insulating plate 112, the second conductive plate 118, the first stack STA, and the second stack STB may be sequentially stacked on the substrate 110.

As shown in FIG. 7C, in a partial region of the connection region CON, a plurality of through openings 420H may be formed to pass through the substrate 110, the insulating plate 112, and the second conductive plate 118. An insulating plug 420 may be in or fill each of the plurality of through openings 420H. The plurality of through openings 420H may be at a position that overlaps a partial region of the peripheral circuit structure PCS in the vertical direction (Z direction). The insulating plug 420 may include a silicon oxide film, a silicon nitride film, or a combination thereof.

In the connection region CON, each of the plurality of through electrodes THV2 may extend to the peripheral circuit structure PCS through the through opening 420H and be electrically connected to a selected one of the plurality of peripheral circuit wiring layers (e.g., ML60, ML61, and ML62). For example, each of the plurality of through electrodes THV2 may be electrically connected to an uppermost one (the peripheral circuit wiring layer ML62) of the peripheral circuit wiring layers ML60, ML61, and ML62, which is closest to the cell array structure CAS. Each of the plurality of through electrodes THV2 may be connected to at least one selected from the plurality of peripheral circuits through the multilayered wiring structure MWS included in the peripheral circuit structure PCS. A detailed configuration of the plurality of through electrodes THV2 may be substantially the same as that of the plurality of through electrodes THV, which has been described with reference to FIGS. 4 and 5C.

Figure 8:
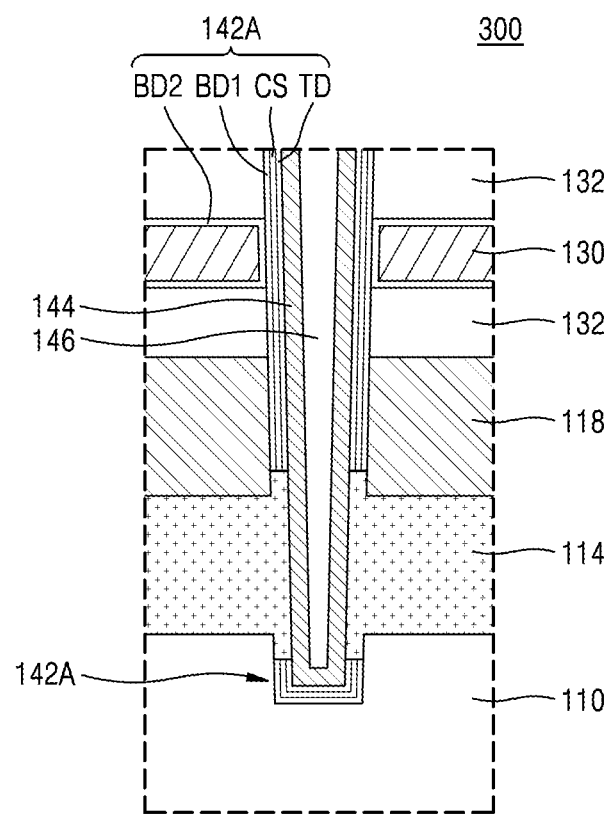
FIG. 8 is a cross-sectional view of a semiconductor device according to embodiments.

FIG. 8 is a cross-sectional view of a semiconductor device 300 according to embodiments. FIG. 8 illustrates an enlarged cross-sectional configuration of a portion corresponding to region "EX1" of FIG. 5A.

Referring to FIG. 8, the semiconductor device 300 may have substantially the same configuration as the semiconductor device 100 described with reference to FIGS. 1 to 6.

However, the semiconductor device 300 may include a gate dielectric film 142A instead of the gate dielectric film 142. The gate dielectric film 142A may have substantially the same configuration as the gate dielectric film 142 described with reference to FIGS. 5A, 5B, and 5D. However, the gate dielectric film 142A may include a first blocking dielectric film BD1 and a second blocking dielectric film BD2 instead of the blocking dielectric film BD. The first blocking dielectric film BD1 may extend in parallel with a channel region 144, and the second blocking dielectric film BD2 may surround a gate line 130. Each of the first blocking dielectric film BD1 and the second blocking dielectric film BD2 may include silicon oxide, silicon nitride, or a metal oxide. For example, the first blocking dielectric film BD1 may include silicon oxide, and the second blocking dielectric film BD2 may include a metal oxide having a higher dielectric constant than a silicon oxide film. The metal oxide may include hafnium oxide, aluminum oxide, zirconium oxide, tantalum oxide, or a combination thereof.

Figure 9:
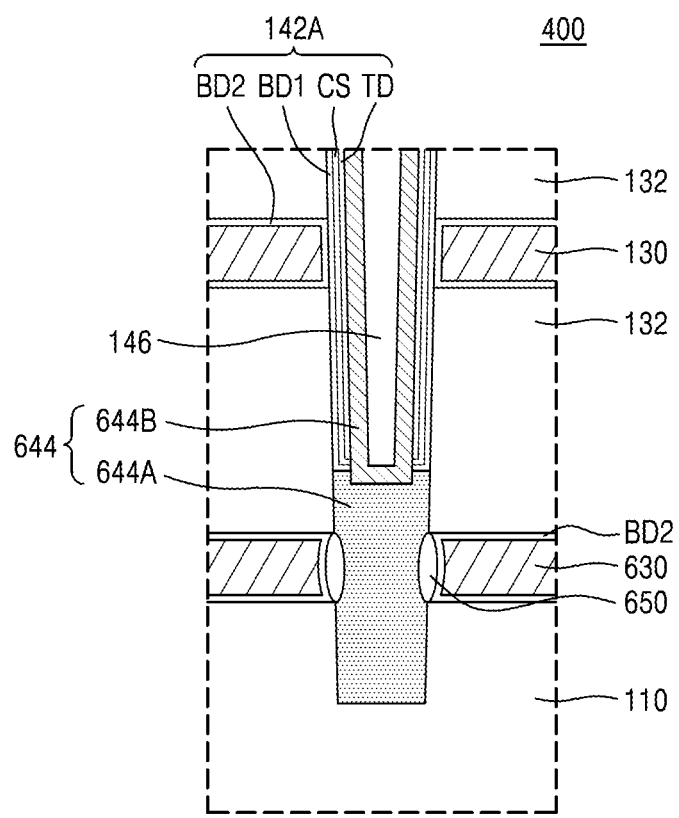
FIG. 9 is a cross-sectional view of a semiconductor device according to embodiments.

FIG. 9 is a cross-sectional view of a semiconductor device 400 according to embodiments. FIG. 9 illustrates an enlarged cross-sectional configuration of a portion corresponding to region "EX1" of FIG. 5A.

Referring to FIG. 9, the semiconductor device 400 may have substantially the same configuration as the semiconductor device 100 described with reference to FIGS. 1 to 6. However, the semiconductor device 400 may include a gate dielectric film 142A instead of the gate dielectric film 142. The gate dielectric film 142A may include a first blocking dielectric film BD1 and a second blocking dielectric film BD2. Detailed configurations of the first blocking dielectric film BD1 and the second blocking dielectric film BD2 may be the same as those described with reference to FIG. 8.

The semiconductor device 400 may include a ground selection gate line 630 between a substrate 110 and a plurality of gate lines 130. Also, the semiconductor device 400 may include a channel region 644 instead of the channel region 144 of the semiconductor device 100. The channel region 644 may include a lower semiconductor pattern 644A and an upper semiconductor pattern 644B. The lower semiconductor pattern 644A may include a semiconductor material layer, which is epitaxially grown on the substrate 110. The lower semiconductor pattern 644A may have a pillar shape, and a top surface of the lower semiconductor pattern 644A may be at a higher level than a top surface of the ground selection gate line 630. The upper semiconductor pattern 644B and the lower semiconductor pattern 644A may be in contact with each other. The lower semiconductor pattern 644A may include Si, Ge, or a combination thereof. The upper semiconductor pattern 644B may have substantially the same configuration as the channel region 144 described with reference to FIGS. 5A, 5B, and 5D.

The ground selection gate line 630 may be surrounded by the second blocking dielectric film BD2. A gate dielectric film 650 may be between the ground selection gate line 630 and the lower semiconductor pattern 644A. The second blocking dielectric film BD2 may be between the gate dielectric film 650 and the ground selection gate line 630.

Figure 10:
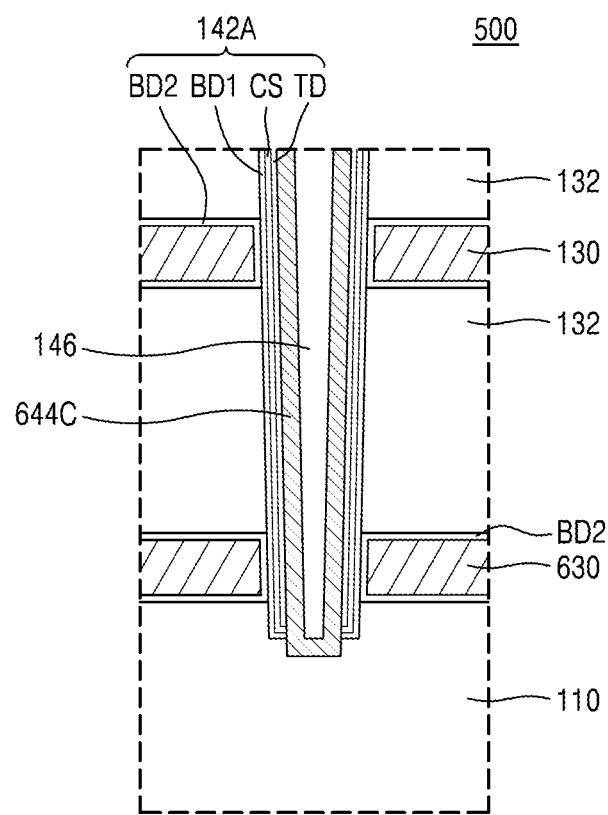
FIG. 10 is a cross-sectional view of a semiconductor device according to embodiments.

FIG. 10 is a cross-sectional view of a semiconductor device 500 according to embodiments. FIG. 10 illustrates an enlarged cross-sectional configuration of a portion corresponding to region "EX1" of FIG. 5A.

Referring to FIG. 10, the semiconductor device 500 may have substantially the same configuration as the semiconductor device 400 described with reference to FIG. 9. However, the semiconductor device 500 may not include the lower semiconductor pattern 644A shown in FIG. 9. The semiconductor device 500 may include a channel region 644C instead of the channel region 144 of the semiconductor device 100. A lower end of the channel region 644C may be in contact with the substrate 110. A gate dielectric film 142A may be between the channel region 644C and a ground selection gate line 630. A detailed configuration of the channel region 644C may be substantially the same as that of the channel region 144, which has been described with reference to FIGS. 5A, 5B, and 5D.

Next, a method of manufacturing a semiconductor device, according to embodiments, will be described in detail.

FIGS. 11A to 17C are cross-sectional views of a method of manufacturing a semiconductor device, according to embodiments. Specifically, FIGS. 11A, 14A, 15A, 16A, and 17A are cross-sectional views of some components of a portion corresponding to a cross-section taken along line Y1-Y1' of FIG. 4, according to a process sequence, FIGS. 11B, 12A, 13A, 14B, 15B, 16B, and 17B are cross-sectional views of some components of a portion corresponding to a cross-section taken long line X1-X1' of FIG. 4, according to the process sequence, and FIGS. 11C, 12B, 13B, 14C, 15C, 16C, and 17C are cross-sectional views of some components of a portion corresponding to a cross-section taken long line X2-X2' of FIG. 4, according to the process sequence. FIGS. 13D and 14D are cross-sectional views of some components of a scribe lane region SLR, according to the process sequence. A method of manufacturing the semiconductor device 100 shown in FIGS. 1 to 6, according to an example embodiment, will be described with reference to FIGS. 11A to 17C.

Figure 11A:
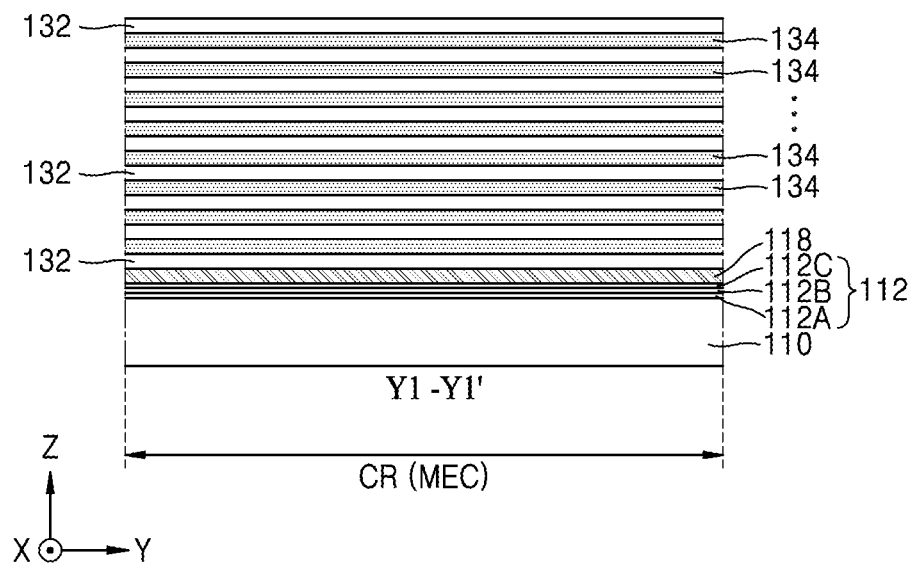
Figure 11B:
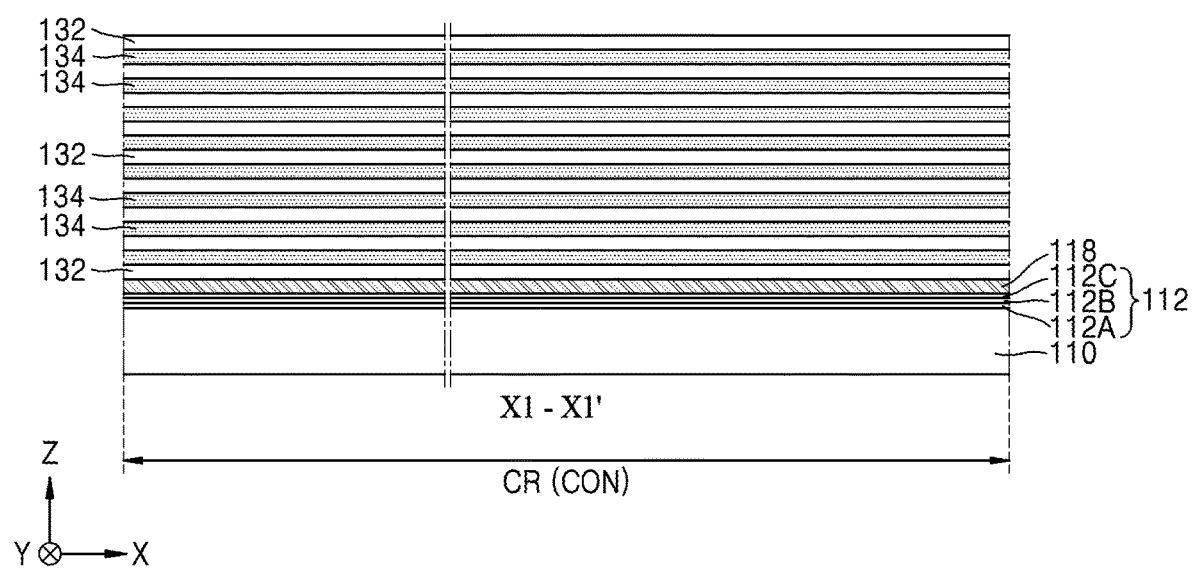
FIGS. 11B, 12A, 13A, 14B, 15B, 16B, and 17B are cross-sectional views of some components of a portion corresponding to a cross-section taken long line X1-X1' of FIG. 4, according to the process sequence.
Figure 11C:
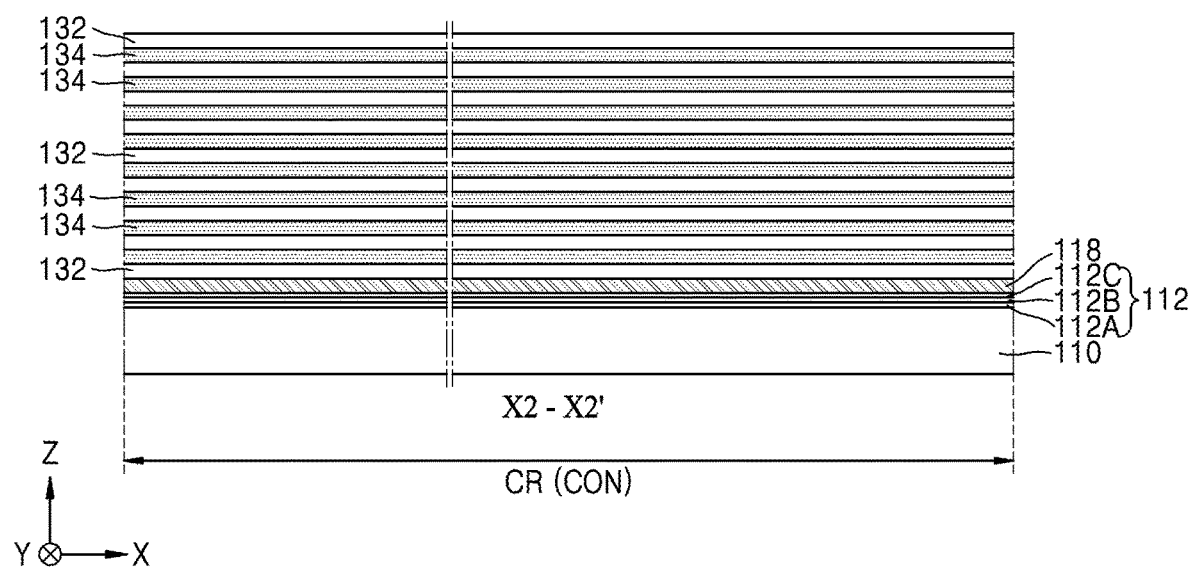

Referring to FIGS. 11A, 11B, and 11C, in a memory cell region MEC and a connection region CON of a chip region CR, an insulating plate 112 and a second conductive plate 118 may be sequentially formed on a substrate 110. The insulating plate 112 may include an insulating film having a multilayered structure, which includes a first insulating film 112A, a second insulating film 112B, and a third insulating film 112C.

In the memory cell region MEC and the connection region CON of the chip region CR, a plurality of insulating films 132 and a plurality of sacrificial insulating films 134 may be alternately stacked one-by-one on the second conductive plate 118. The plurality of insulating films 132 may include a silicon oxide film, and the plurality of sacrificial insulating films 134 may include silicon nitride. Each of the plurality of sacrificial insulating films 134 may ensure a space for forming a plurality of gate lines 130 in a subsequent process.

Figure 12A:
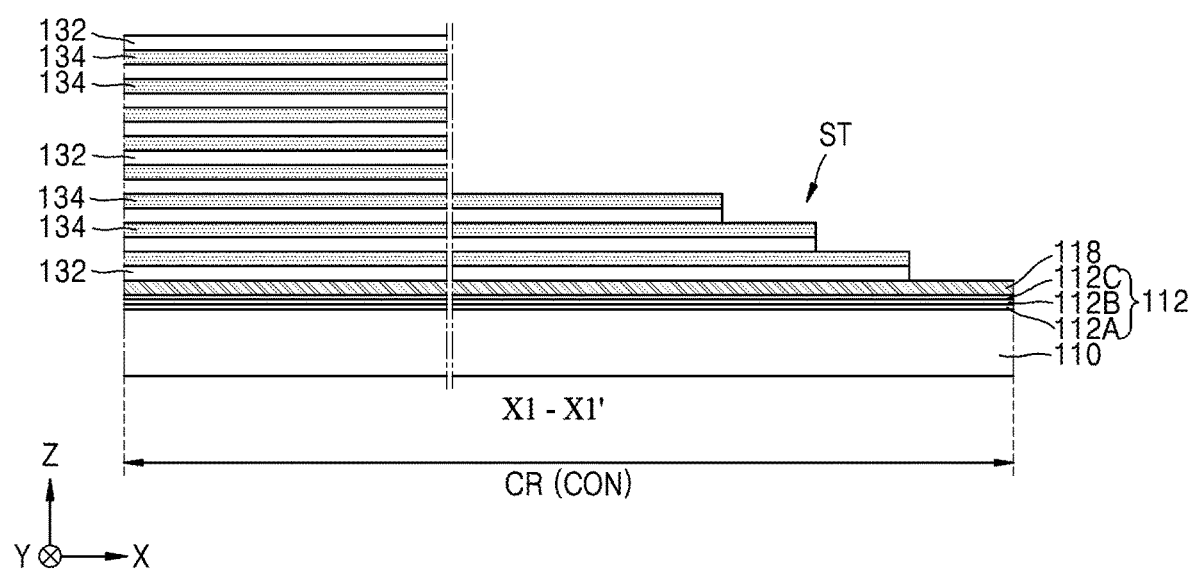
Figure 12B:
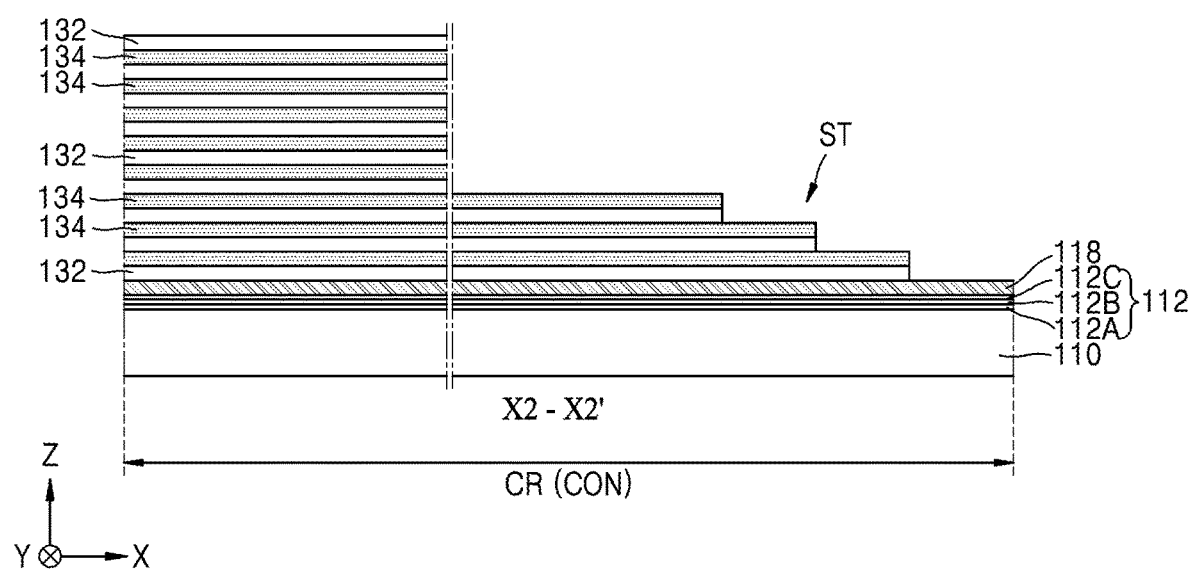

Referring to FIGS. 12A and 12B, in the resultant structure of FIGS. 11A, 11B, and 11C, a portion of each of the plurality of insulating films 132 and the plurality of sacrificial insulating films 134 may be removed from the connection region CON of the chip region CR with an etch stop film (not shown) covering an uppermost one of the plurality of insulating films 132 as an etch mask, thereby forming a staircase structure ST. In the staircase structure ST, one end of each of the plurality of insulating films 132 and the plurality of sacrificial insulating films 134 may have a gradually smaller width in a direction away from the substrate 110 in a lateral direction.

Figure 13A:
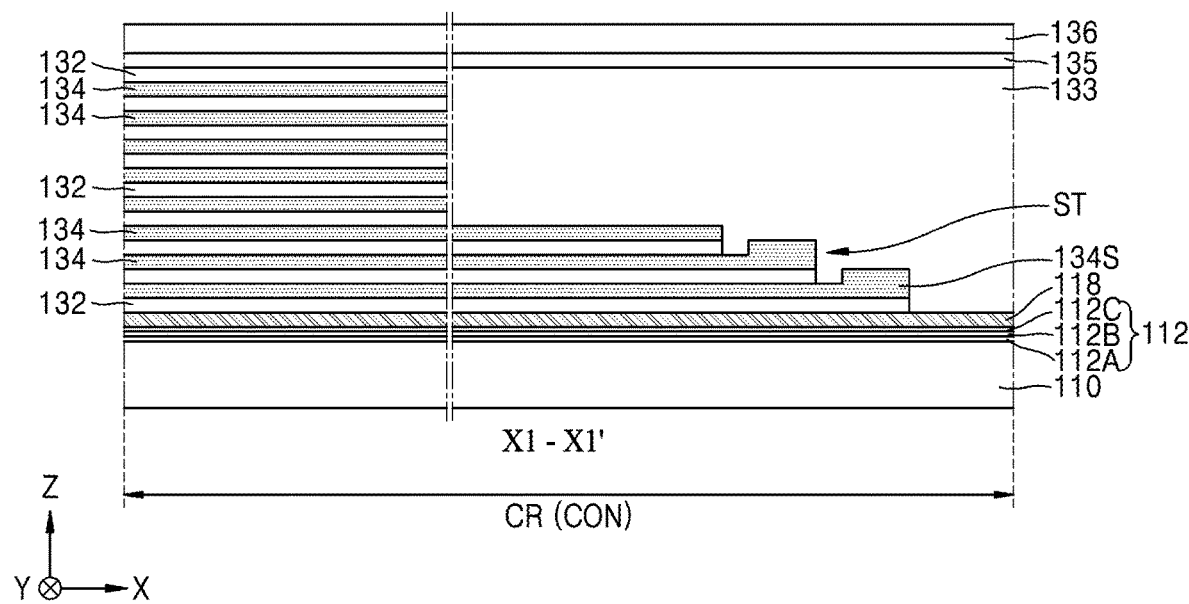
Figure 13B:
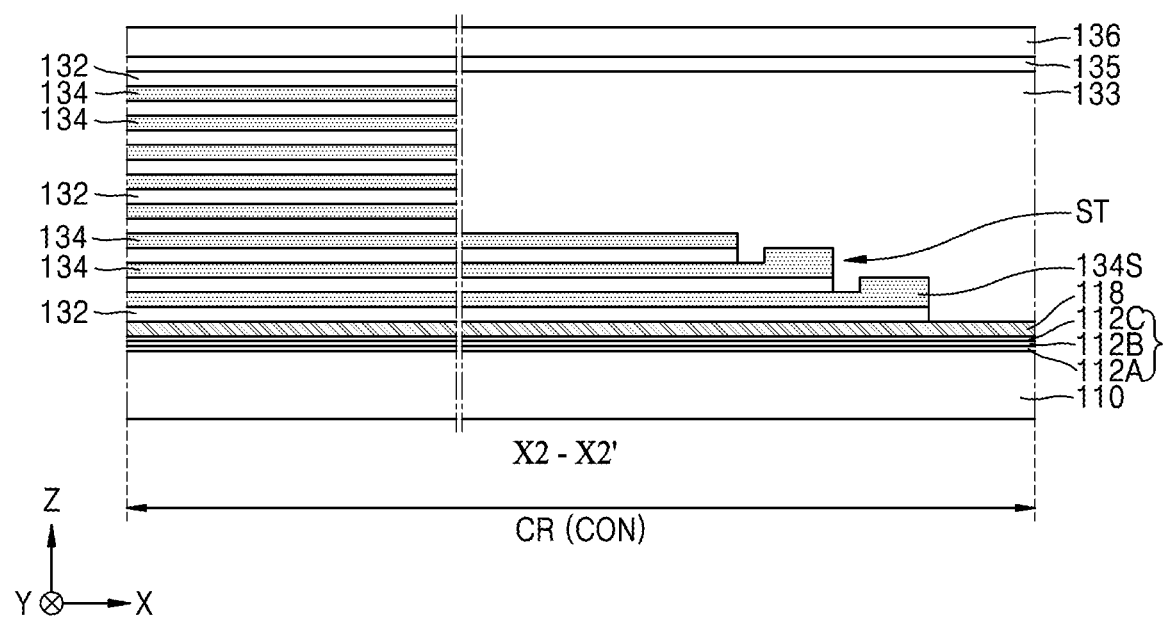
Figure 13C:
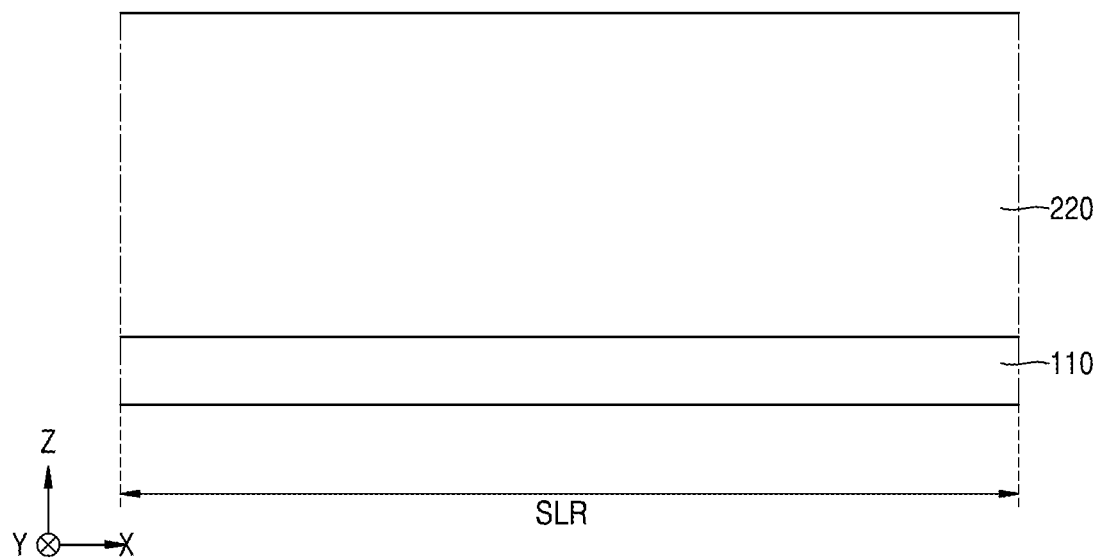
FIGS. 13C and 14D are cross-sectional views of some components of a scribe lane region, according to the process sequence.

Referring to FIGS. 13A, 13B, and 13C, in the connection region CON of the chip region CR, a sacrificial pad portion 134S having an increased thickness may be formed at one end of each of the plurality of sacrificial insulating films 134 included in the staircase structure ST.

In example embodiments, to form the sacrificial pad portion 134S at one end of each of the plurality of sacrificial insulating films 134, portions of the plurality of insulating films 132 may be removed to expose one end of each of the plurality of sacrificial insulating films 134 included in the staircase structure ST. Thereafter, an additional film may be deposited on the exposed end of each of the plurality of sacrificial insulating films 134. The additional film may include the same material as a constituent material of the plurality of sacrificial insulating films 134. The additional film may be patterned to leave the sacrificial pad portion 134S.

Thereafter, a lower insulating block 133 may be formed to cover the staircase structure ST and the second conductive plate 118. The obtained resultant structure may be planarized using a chemical mechanical polishing (CMP) process to remove unnecessary films and expose a top surface of the uppermost one of the insulating films 132. Afterwards, a first middle insulating film 135 and a second middle insulating film 136 may be sequentially formed to cover the top surface of each of the uppermost one of the insulating films 132 and the lower insulating block 133.

As shown in FIG. 13C, after the second middle insulating film 136 is formed in the chip region CR shown in FIGS. 13A and 13B, an insulating structure 220 may remain on the substrate 110 in the scribe lane region SLR. The insulating structure 220 may include the same material as a selected one of the lower insulating block 133, the first middle insulating film 135, and the second middle insulating film 136, which are in the chip region CR.

Referring to FIGS. 14A, 14B, 14C, and 14D, in the connection region CON and the memory cell region MEC of the chip region CR, a stack structure of the second middle insulating film 136, the first middle insulating film 135, the lower insulating block 133, the plurality of insulating films 132, and the plurality of sacrificial insulating films 134, the second conductive plate 118, and the insulating plate 112 may be dry etched, and thus, a plurality of lower vertical holes may be formed.

Figure 14A:
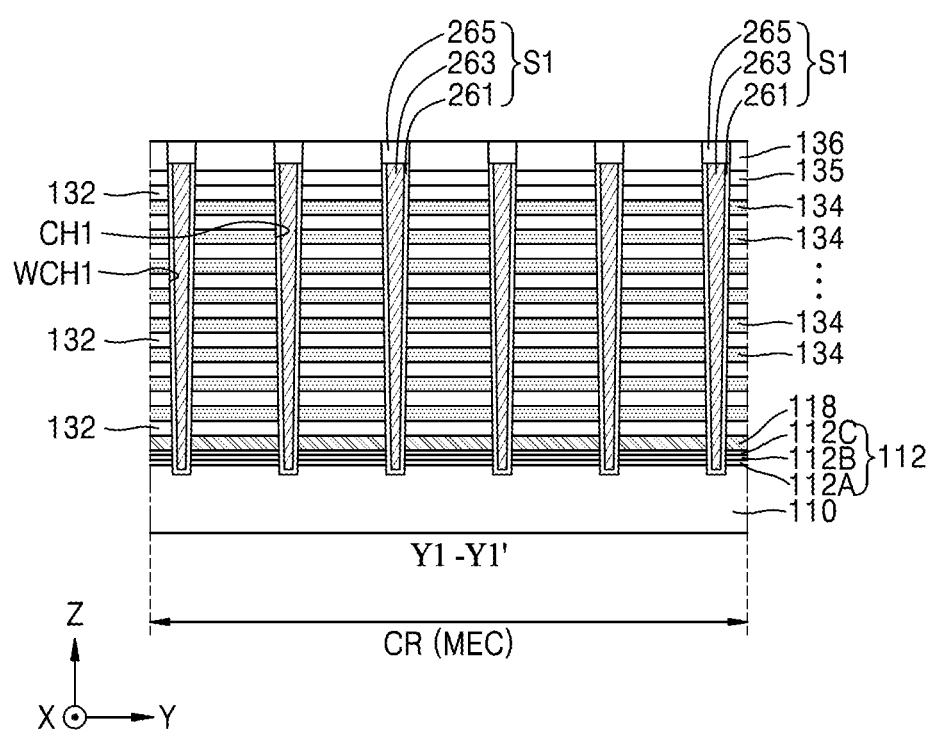
Figure 14B:
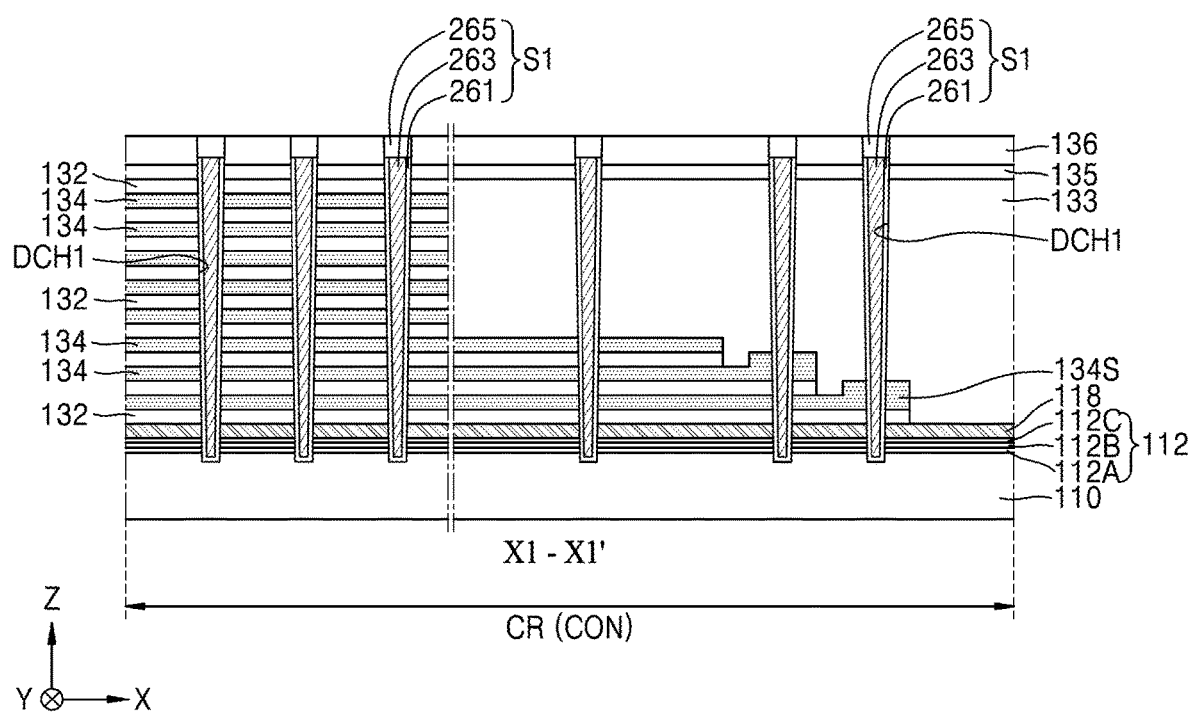
Figure 14C:
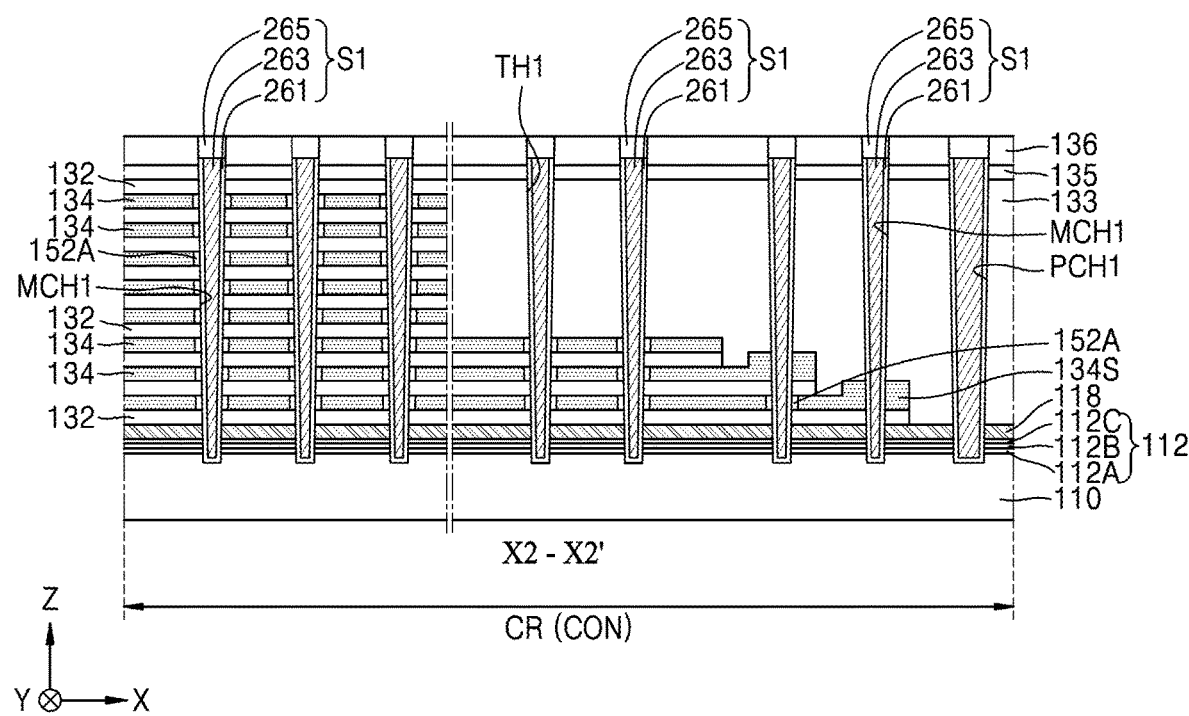

As shown in FIGS. 14A, 14B, and 14C, in the chip region CR, the plurality of lower vertical holes may include a plurality of lower channel holes CH1 and a plurality of lower word line cut holes WCH1, which are in the memory cell region MEC, and a plurality of lower dummy channel holes DCH1, a plurality of lower memory cell contact holes MCH1, a lower plate contact hole PCH1, and a plurality of lower through holes TH1, which are in the connection region CON. Although not shown in FIGS. 14A, 14B, and 14C, the plurality of lower vertical holes may further include lower vertical holes required for forming the plurality of insulating support structures SP shown in FIG. 4 in the connection region CON of the chip region CR.

Thereafter, as shown in FIG. 14C, portions of the sacrificial pad portion 134S and the sacrificial insulating film 134, which are respectively exposed by the plurality of lower memory cell contact holes MCH1 and the plurality of lower through holes TH1, may be etched, and thus, a lateral width of each of the plurality of lower memory cell contact holes MCH1 and the plurality of lower through holes TH1 may be expanded at the same vertical level as the sacrificial insulating film 134. As a result, a plurality of indent spaces expose or contact sidewalls of the sacrificial pad portion 134S and the sacrificial insulating film 134. From among the plurality of indent spaces, an indent space on the sacrificial insulating film 134 may be filled with a first insulating ring 152A or the first insulating ring 152A may be in the indent space, and an indent space on the sacrificial pad portion 134S may be further filled with the sacrificial pad portion 134S Thereafter, as shown in FIGS. 14A, 14B, and 14C, a plurality of lower sacrificial structures S1 may be formed in or to fill the plurality of lower vertical holes. To form the plurality of lower sacrificial structures S1, initially, a first carbon-containing barrier film 261 may be formed on (e.g., to conformally cover) an inner sidewall of each of the plurality of lower vertical holes. Thereafter, a sacrificial metal film 263 may be formed in or to fill the remaining space of each of the plurality of lower vertical holes on the first carbon-containing barrier film 261. The sacrificial metal film 263 may be in contact with the first carbon-containing barrier film 261. Afterwards, a portion of each of the first carbon-containing barrier film 261 and the sacrificial metal film 263 is removed to empty an entrance space of each of the plurality of lower vertical holes. Thereafter, a second carbon-containing barrier film 265 may be formed in or to fill the entrance space of each of the plurality of lower vertical holes.

Each of the first carbon-containing barrier film 261 and the second carbon-containing barrier film 265 may include carbon atoms and nitrogen atoms. In example embodiments, each of the first carbon-containing barrier film 261 and the second carbon-containing barrier film 265 may include a BCN thin film. In other example embodiments, the first carbon-containing barrier film 261 and the second carbon-containing barrier film 265 may include SiCN, SiOCN, SiBCN, or a combination thereof. In example embodiments, the first carbon-containing barrier film 261 and the second carbon-containing barrier film 265 may have an h-BCN structure in which carbon atoms, boron atoms, and nitrogen atoms are regularly arranged. In other example embodiments, the first carbon-containing barrier film 261 and the second carbon-containing barrier film 265 include at least 30 at % of carbon atoms. For example, a content of carbon atoms in the first carbon-containing barrier film 261 and the second carbon-containing barrier film 265 may be in a range of about 30 at % to about 60 at %, without being limited thereto. In example embodiments, the sacrificial metal film 263 may include tungsten (W).

Because the first carbon-containing barrier film 261 and the second carbon-containing barrier film 265 include the carbon atoms, the first carbon-containing barrier film 261 and the second carbon-containing barrier film 265 may be easily removed using an ashing process in a subsequent process. Because the first carbon-containing barrier film 261 includes the carbon atoms, adhesion of the first carbon-containing barrier film 261 with the sacrificial metal film 263 may be improved.

As a comparative example, when a metal nitride film (e.g., a titanium nitride (TiN) film) is formed instead of the first carbon-containing barrier film 261, metal silicide by-products may be undesirably formed on a surface of a silicon-containing film (e.g., the plurality of insulating films 132 and/or the plurality of sacrificial insulating films 134), which form inner sidewalls of the plurality of lower vertical holes (e.g., the plurality of lower channel holes CH1, the plurality of lower dummy channel holes DCH1, and the plurality of lower word line cut holes WCH1), or metal residue (e.g., titanium) may remain inside the lower vertical holes. Therefore, the performance of the semiconductor device 100 may deteriorate.

As another comparative example, a double structure including a silicon oxide liner and a metal nitride film (e.g., a TiN film) may be formed instead of the first carbon-containing barrier film 261. The silicon oxide liner may be in contact with the plurality of insulating films 132 and the plurality of sacrificial insulating films 134, which are exposed at the plurality of lower vertical holes, and the metal nitride film may be in contact with the silicon oxide liner. In this case, when the silicon oxide liner and the metal nitride film are removed using a wet etching process in a subsequent process, the plurality of insulating films 132 exposed at the plurality of lower vertical holes may be damaged, and thus, surface defects (e.g., dimples) may be caused in the plurality of insulating films 132.

According to embodiments, the plurality of lower sacrificial structures S1 may include the plurality of insulating films 132 exposed at the plurality of lower vertical holes and the first carbon-containing barrier film 261 in contact with the plurality of sacrificial insulating films 134, and the first carbon-containing barrier film 261 may not include a metal. Accordingly, the formation of desired metal silicide by-products inside the plurality of lower vertical holes or damage to the plurality of insulating films 132 and the plurality of sacrificial insulating films 134, which are exposed at the plurality of lower vertical holes, may be prevented until the plurality of lower sacrificial structures S1 are removed in a subsequent process after the plurality of lower sacrificial structures S1 are formed.

Figure 14D:
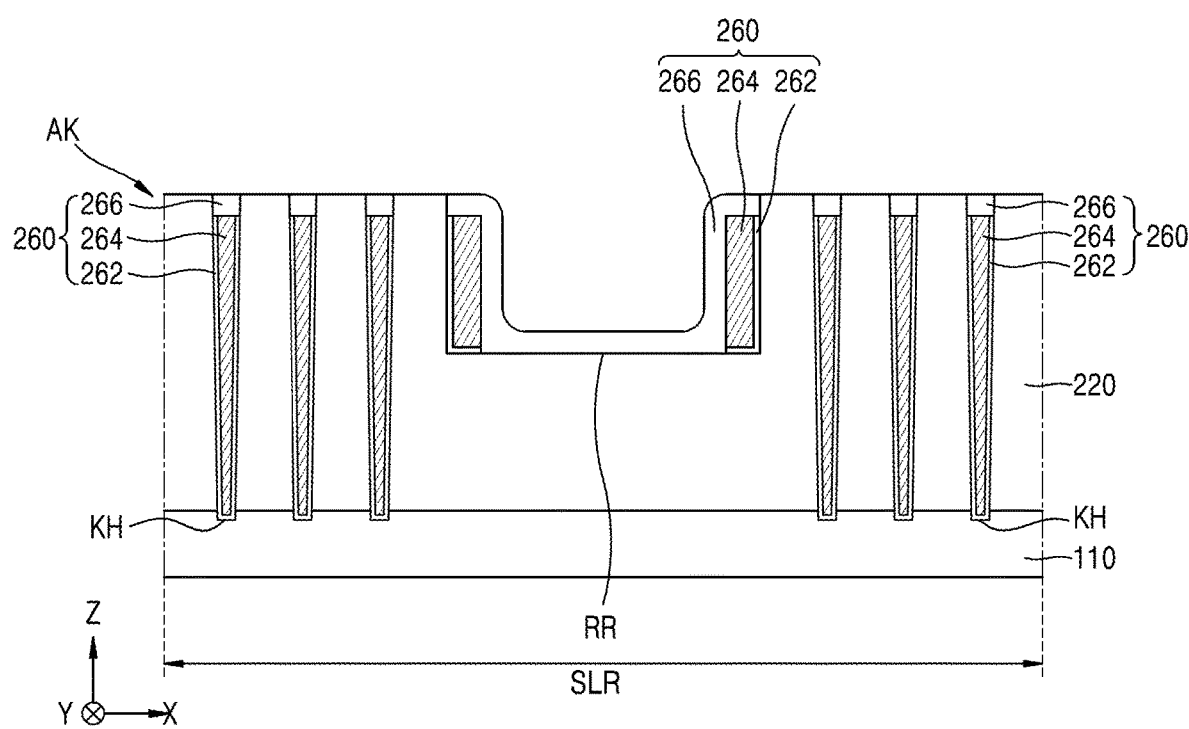

As shown in FIG. 14D, during the formation of the plurality of lower vertical holes in the chip region CR shown in FIGS. 14A, 14B, and 14C, a recess region RR and a plurality of key holes KH may be formed in the insulating structure 220 in the scribe lane region SLR. The plurality of key holes KH may be adjacent to the recess region RR. In addition, during the formation of the first carbon-containing barrier film 261, the sacrificial metal film 263, and the second carbon-containing barrier film 265 in the chip region CR, a first carbon-containing barrier film 262, an alignment metal film 264, and a second carbon-containing barrier film 266 may be formed inside each of the recess region RR and the plurality of key holes KH in the scribe lane region SLR.

The first carbon-containing barrier films 261 and 262 may be formed simultaneously. The first carbon-containing barrier films 261 and 262 may include the same material. In the recess region RR of the scribe lane region SLR, the first carbon-containing barrier film 262 may be formed on (e.g., to conformally cover) an inner sidewall of the recess region RR. Inside each of the plurality of key holes KH of the scribe lane region SLR, the first carbon-containing barrier film 262 may be formed on (e.g., to conformally cover) an inner surface of each of the plurality of key holes KH. As used herein, the first carbon-containing barrier film 262 formed in the scribe lane region SLR may be referred to as an alignment barrier film.

During the formation of the sacrificial metal film 263 in the chip region CR as shown in FIGS. 14A, 14B, and 14C, the alignment metal film 264 may be formed on the first carbon-containing barrier film 262 in the scribe lane region SLR as shown in FIG. 14D. A bottom surface of the alignment metal film 264 may be in contact with a top surface of the first carbon-containing barrier film 262. The sacrificial metal film 263 and the alignment metal film 264 may be formed simultaneously. The sacrificial metal film 263 and the alignment metal film 264 may include the same material.

During the removal of a portion of each of the first carbon-containing barrier film 261 and the sacrificial metal film 263 from the chip region CR to empty the entrance space of each of the plurality of lower vertical holes, portions of the first carbon-containing barrier film 262 and the alignment metal film 264 may be removed from the scribe lane region SLR. In this case, portions of the first carbon-containing barrier film 262 and the alignment metal film 264, which cover a bottom surface of the recess region RR, may be removed, and thus, the insulating structure 220 may be exposed at the bottom surface of the recess region RR and an entrance space of each of the plurality of key holes KH may be emptied.

Thereafter, during the formation of the second carbon-containing barrier film 265 in or to fill the entrance space of each of the plurality of lower vertical holes in the chip region CR, the second carbon-containing barrier film 266 may be formed in the scribe lane region SLR. A portion of the second carbon-containing barrier film 266, which is formed inside the recess region RR, may be on (e.g., conformally cover) the bottom surface of the recess region RR and a sidewall of the alignment metal film 264. Portions of the second carbon-containing barrier film 266, which are formed inside the plurality of key holes KH, may be in or fill the respective entrance spaces of the plurality of key holes KH. The second carbon-containing barrier films 265 and 266 may be formed simultaneously. The second carbon-containing barrier films 265 and 266 may include the same material.

In the scribe lane region SLR, the first carbon-containing barrier film 262, the alignment metal film 264, and the second carbon-containing barrier film 266 may constitute an alignment key structure 260. At least one alignment key structure in the scribe lane region SLR may constitute an alignment key AK.

Thereafter, as shown in FIG. 6, an insulating film 270 may be formed in or to fill the remaining space on the second carbon-containing barrier film 266 inside the recess region RR of the scribe lane region SLR.

Figure 15A:
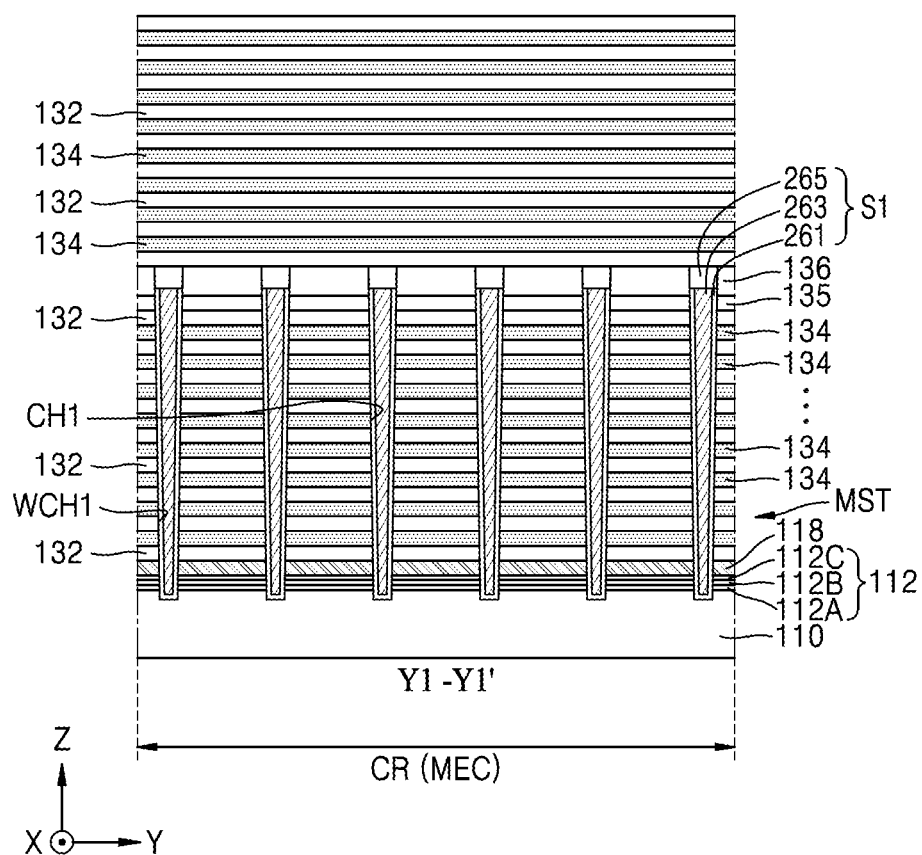
Figure 15B:
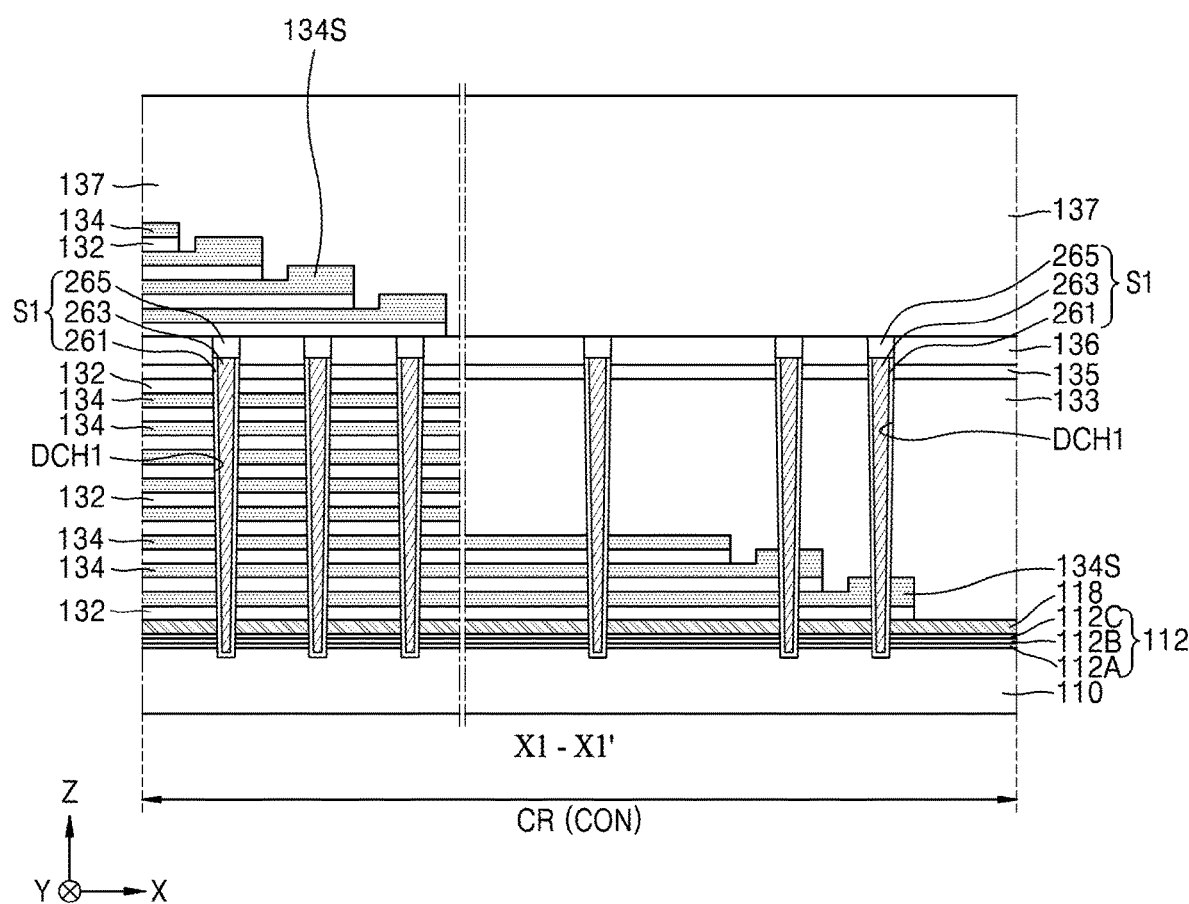
Figure 15C:
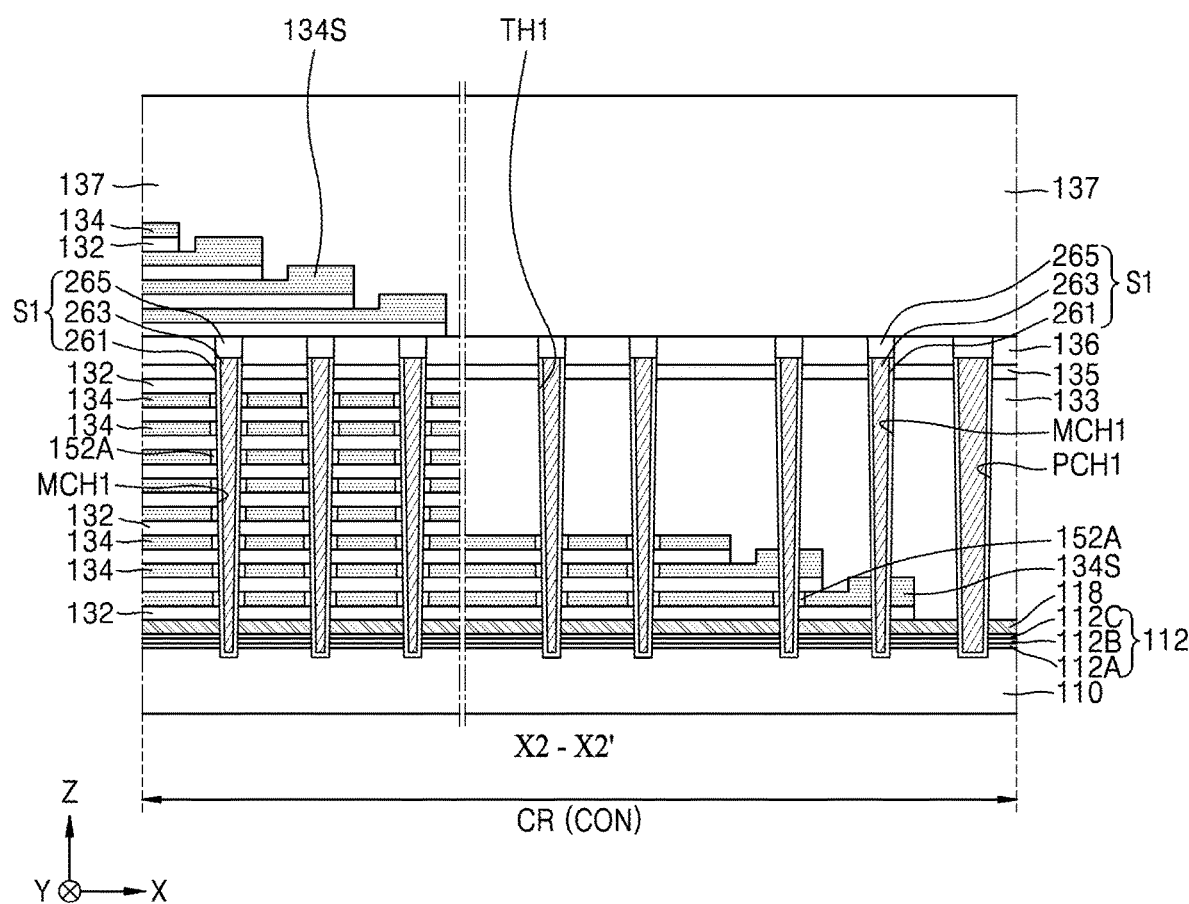

Referring to FIGS. 15A, 15B, and 15C, processes similar to those described with reference to FIGS. 11A to 12B may be performed in the chip region CR. A structure including the plurality of insulating films 132, the plurality of sacrificial insulating films 134, and a plurality of the sacrificial pad portion 134S, which are required to form a second stack STB (refer to FIGS. 5A to 5C), may be formed on the second middle insulating film 136. An upper insulating block 137 covering the structure may be formed in the connection region CON of the chip region CR. The upper insulating block 137 may include the same material as the lower insulating block 133.

Figure 16A:
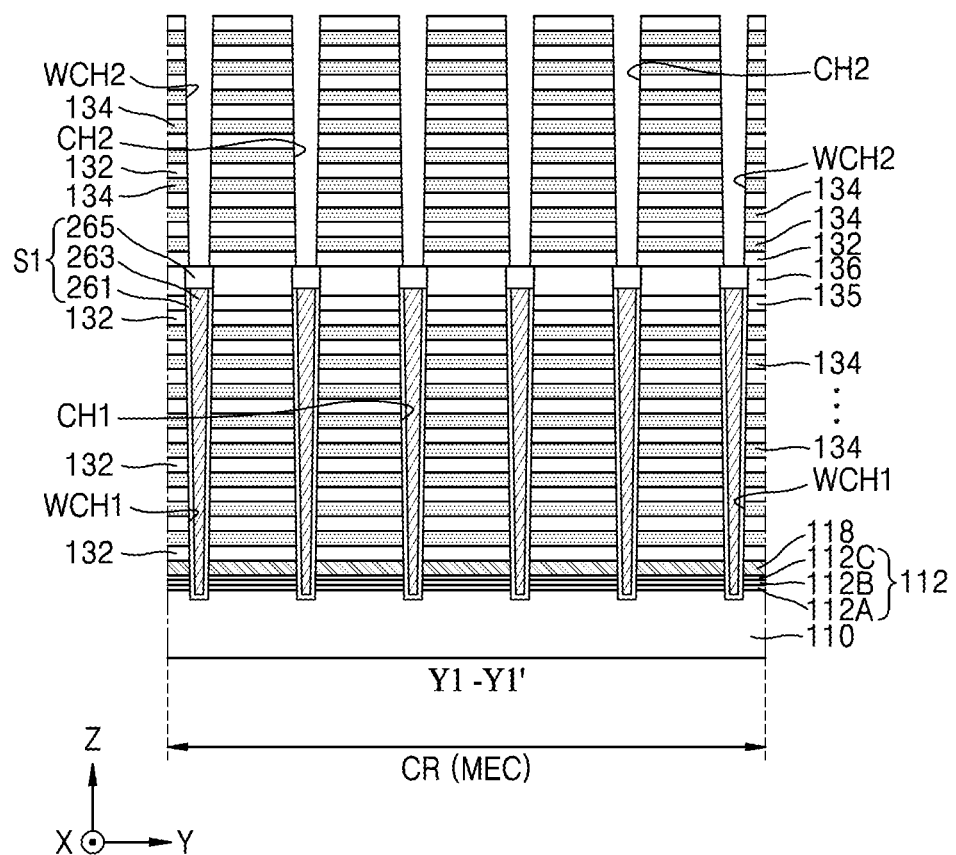
Figure 16B:
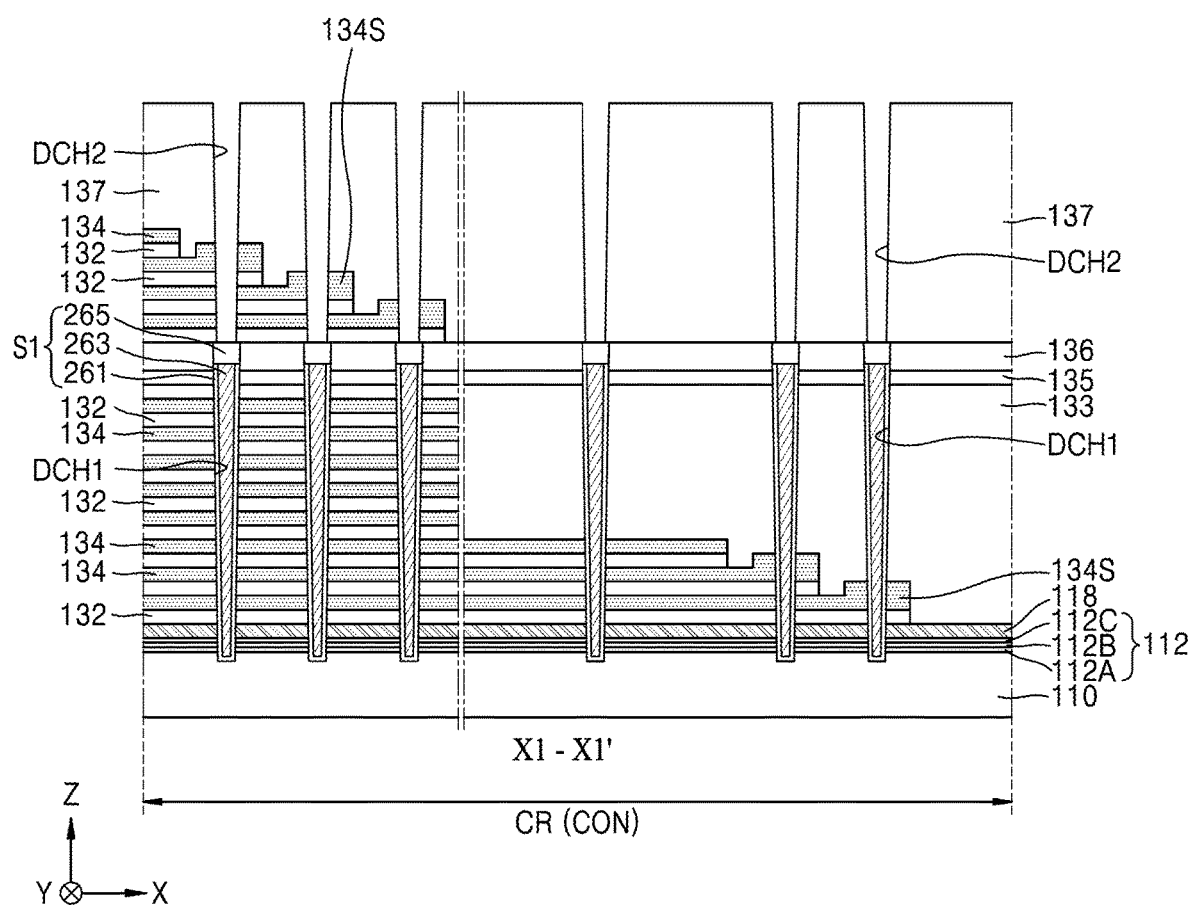
Figure 16C:
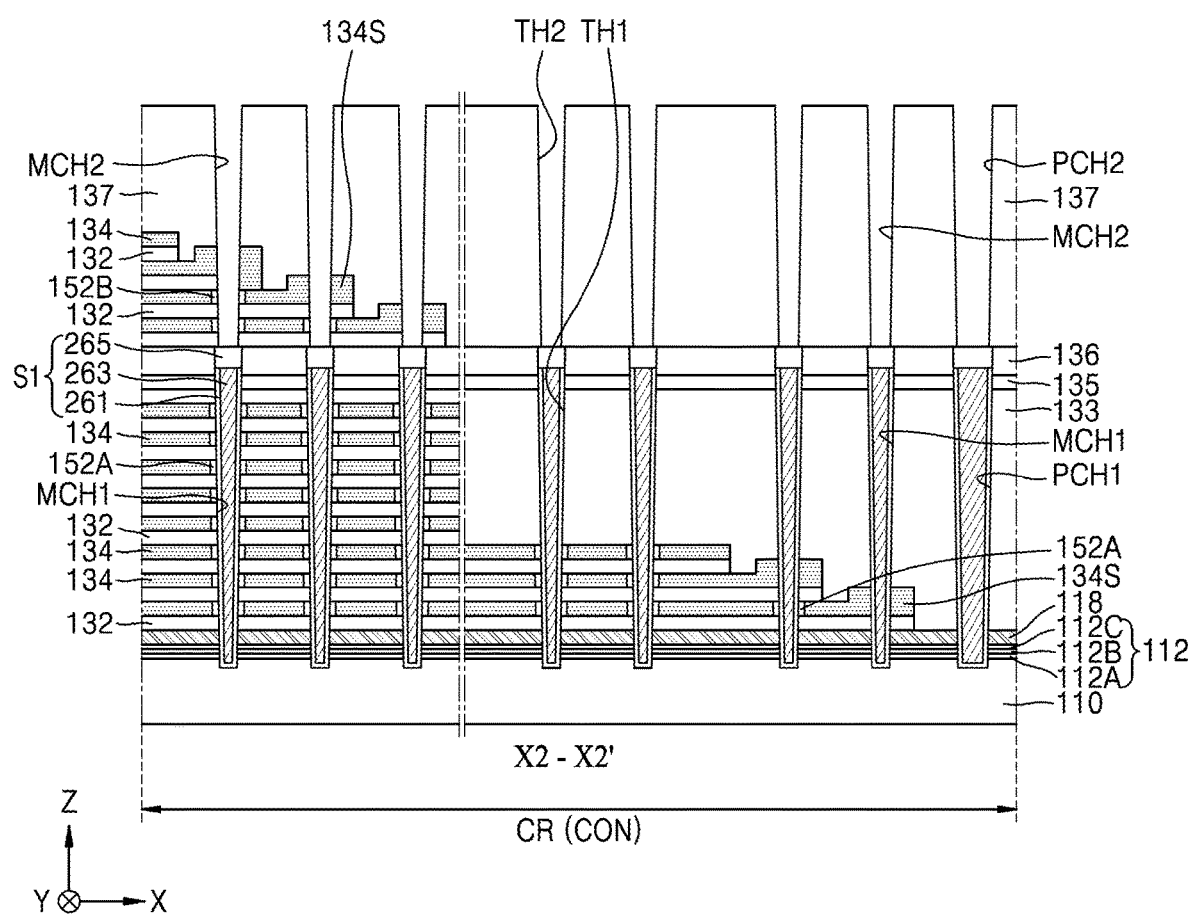

Referring to FIGS. 16A, 16B, and 16C, in the resultant structure of FIGS. 15A, 15B, and 15C, the structure including the plurality of insulating films 132, the plurality of sacrificial insulating films 134, and the plurality of the sacrificial pad portion 134S, which are required to form the second stack STB (refer to FIGS. 5A to 5C), and the upper insulating block 137 may be dry etched in the memory cell region MEC and the connection region CON of the chip region CR. Thus, a plurality of upper vertical holes, which are connected to the plurality of lower vertical holes, may be formed. The plurality of upper vertical holes may include a plurality of upper channel holes CH2 and a plurality of upper word line cut holes WCH2, which are in the memory cell region MEC, and a plurality of upper dummy channel holes DCH2, a plurality of upper memory cell contact holes MCH2, an upper plate contact hole PGH2, and a plurality of upper through holes TH2, which are in the connection region CON. Although not shown in FIGS. 16A, 16B, and 16C, the plurality of upper vertical holes may further include a plurality of upper holes required to form the plurality of insulating support structures SP shown in FIG. 4. The second carbon-containing barrier film 265 in each of the plurality of lower sacrificial structures S1 may be exposed through the plurality of upper vertical holes.

Figure 17A:
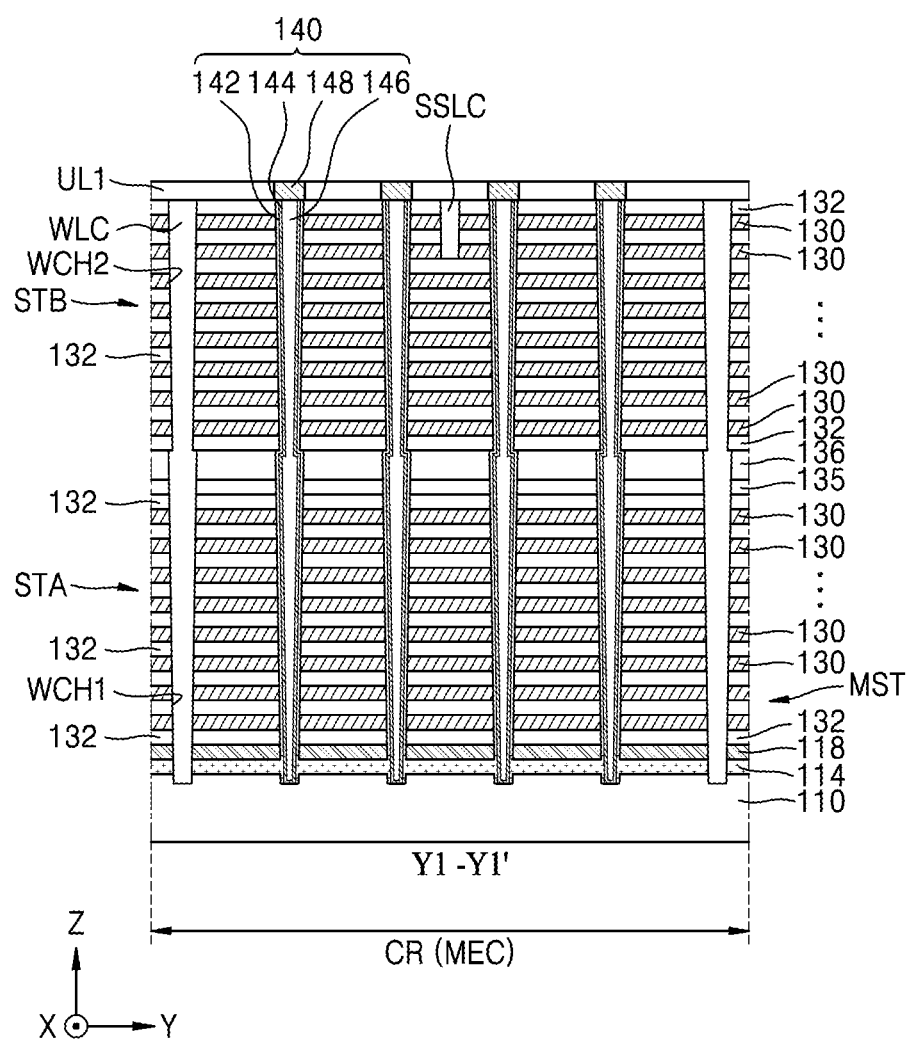
Figure 17B:
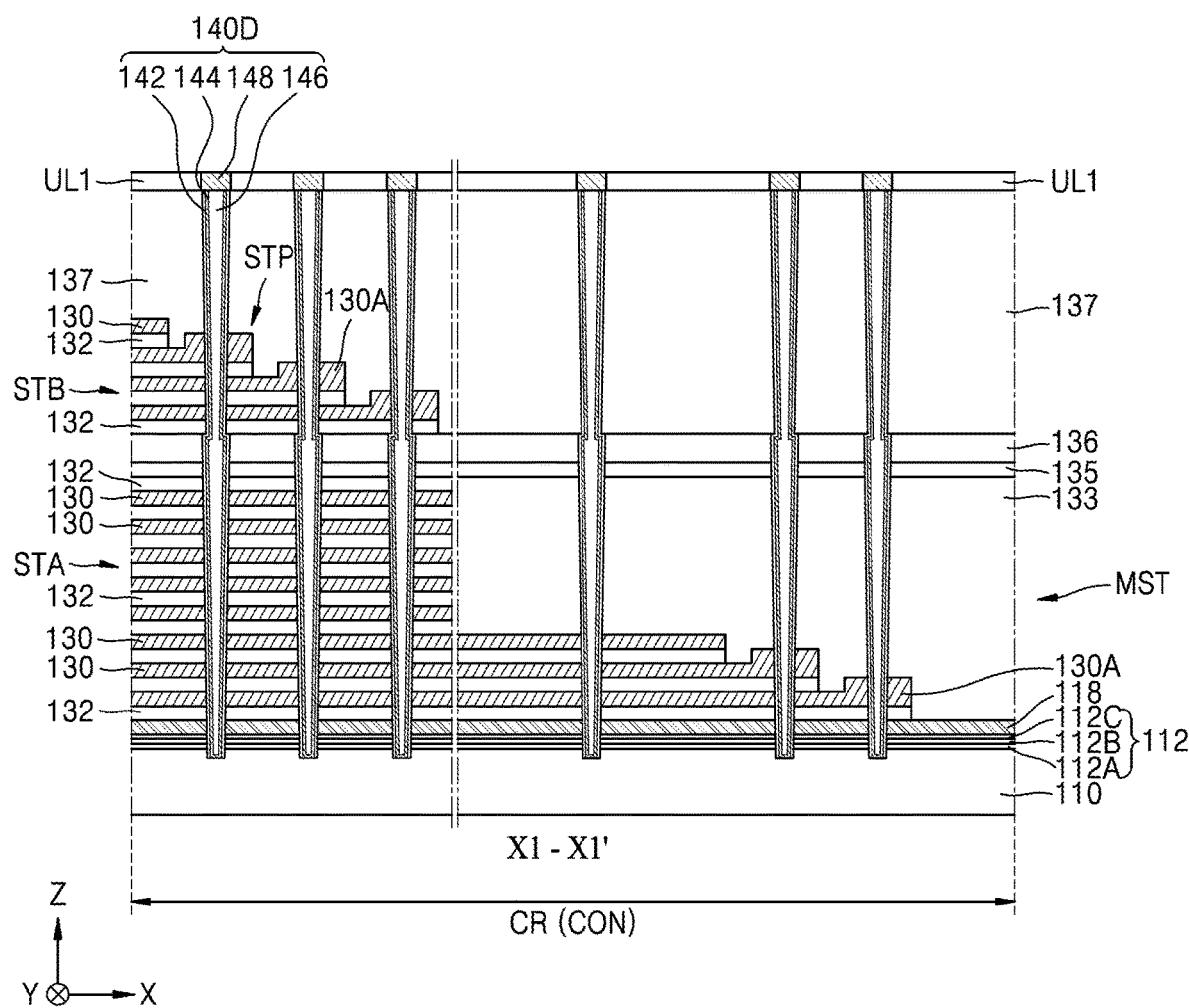
Figure 17C:
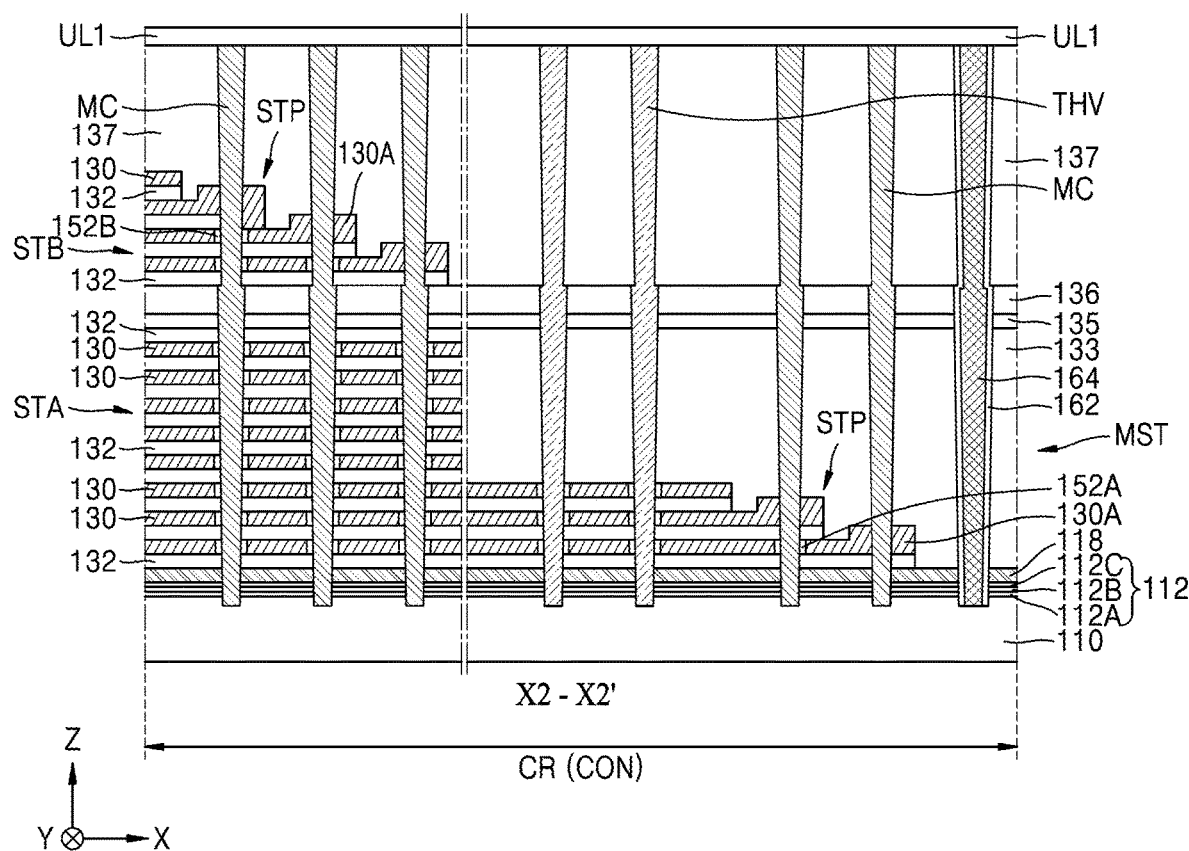

Referring to FIGS. 17A, 17B, and 17C, the plurality of lower sacrificial structures S1 may be removed from the resultant structure of FIGS. 16A, 16B, and 16C through the plurality of upper vertical holes, and thus, the plurality of lower vertical holes and the plurality of upper vertical holes may be emptied. To remove the plurality of lower sacrificial structures S1, to begin with, the second carbon-containing barrier film 265 may be removed through the plurality of upper vertical holes with an ashing process, and thus, the sacrificial metal film 263 may be exposed through the plurality of upper vertical holes in the chip region CR. The exposed sacrificial metal film 263 may be removed with a wet process, a dry process, or a combination thereof to expose the first carbon-containing barrier film 261 inside each of the plurality of lower vertical holes and the plurality of upper vertical holes. Thereafter, the first carbon-containing barrier film 261 may be removed through the plurality of upper vertical holes with an ashing process. By easily removing the first carbon-containing barrier film 261 and the second carbon-containing barrier film 265 with an ashing process, during the removal of the first carbon-containing barrier film 261 and the second carbon-containing barrier film 265, damage to the plurality of insulating films 132 and the plurality of sacrificial insulating films 134, which are respectively exposed inside the plurality of lower vertical holes and the plurality of upper vertical holes, may be prevented. Accordingly, the reliability of the semiconductor device 100 that has been completed through a subsequent process may be prevented from being adversely affected.

Thereafter, in the memory cell region MEC and the connection region CON of the chip region CR, a plurality of plug structures may be formed inside the plurality of lower vertical holes and the plurality of upper vertical holes. The plurality of plug structures may include a plurality of channel structures 140, a plurality of word line cut structures WLC, a plurality of dummy channel structures 140D, a plurality of memory cell contacts MC, a plurality of through electrodes THV, the plurality of insulating support structures SP, and a conductive plate contact 164. The plug structure including the conductive plate contact 164 may further include an insulating spacer 162 surrounding the conductive plate contact 164. Thereafter, a first upper insulating film UL1 may be formed to cover the plurality of plug structures in the memory cell region MEC and the connection region CON of the chip region CR.

The order of formation of the plurality of channel structures 140, the plurality of word line cut structures WLC, the plurality of dummy channel structures 140D, the plurality of memory cell contacts MC, the plurality of through electrodes THV, the plurality of insulating support structures SP, and the conductive plate contact 164, which are included in the plurality of plug structures, may be variously selected as needed.

However, after the plurality of channel structures 140 and the plurality of dummy channel structures 140D are formed and before the plurality of word line cut structures WLC are formed, the plurality of lower sacrificial structures S1 and a plurality of upper sacrificial structures S2, which are in or fill the plurality of lower word line cut holes WCH1 and the plurality of upper word line cut holes WCH2, may be removed, and the insulating plate 112 may be selectively removed from only the memory cell region MEC, from among the memory cell region MEC and the connection region CON of the chip region CR through the plurality of lower word line cut holes WCH1 and the plurality of upper word line cut holes WCH2. The first conductive plate 114 may be in or fill the resultant empty spaces. During the removal of the insulating plate 112 from the memory cell region MEC, portions of a gate dielectric film 182, which are included in a channel structure 180 and are adjacent to the insulating plate 112, may be removed together with the insulating plate 112 from the memory cell region MEC. As a result, the first conductive plate 114 may pass through a partial region of the gate dielectric film 182 in a lateral direction and be in contact with a channel region 184.

Furthermore, after the first conductive plate 114 is formed and before the plurality of word line cut structures WLC are formed, the plurality of sacrificial insulating films 134 and the sacrificial pad portion 134S (refer to FIGS. 16B and 16C) may be replaced by the plurality of gate lines 130 and the plurality of conductive pad units 130A through the plurality of lower word line cut holes WCH1 and the plurality of upper word line cut holes WCH2 in the memory cell region MEC and the connection region CON. After the first conductive plate 114 and the plurality of gate lines 130 are formed, the plurality of word line cut structures WLC may be formed in or to fill the plurality of lower word line cut holes WCH1 and the plurality of upper word line cut holes WCH2.

Thereafter, on the resultant structure of FIGS. 17A, 17B, and 17C, a second upper insulating film UL2 may be formed to sequentially cover a first upper insulating film UL1 and a plurality of drain regions 148, and a plurality of contact plugs 172 may be formed in the connection region CON to pass through the first upper insulating film UL1 and the second upper insulating film UL2. A plurality of upper wiring layers UML may be formed on the second upper insulating film UL2 and the plurality of contact plugs 172 in the connection region CON. A plurality of contact plugs 176 may be formed in the memory cell region MEC such that the plurality of contact plugs 176 pass through the second upper insulating film UL2 and are connected to the drain regions 148 of the plurality of channel structures 140. A plurality of bit lines BL may be formed on the second upper insulating film UL2 and connected to the plurality of contact plugs 176. A third upper insulating film UL3 may be formed in or to fill respective spaces between the plurality of upper wiring layers UML and the plurality of bit lines BL. Thus, the semiconductor device 100 shown in FIGS. 1 to 6 may be manufactured.

Although the method of manufacturing the semiconductor device 100 shown in FIGS. 1 to 6 have been described with reference to FIGS. 11A to 17C, it will be understood that the semiconductor devices 200, 300, 400, and 500 described with reference to FIGS. 7A to 10 and semiconductor devices having various structures may be manufactured by making various modifications and changes within the scope of the inventive concept.

Figure 18:
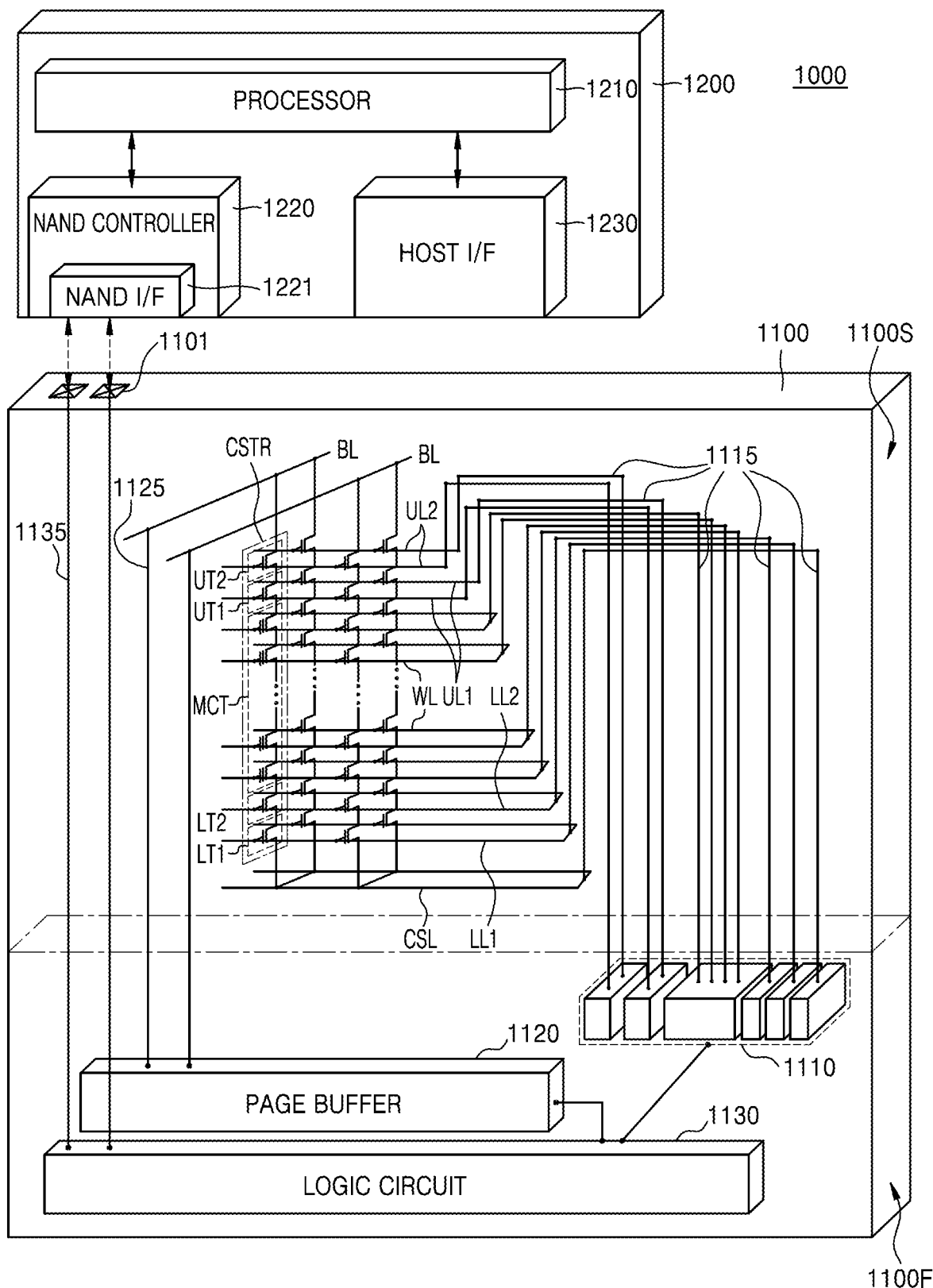
FIG. 18 is a diagram of an electronic system 1000 including a semiconductor device 1100 according to example embodiments.

FIG. 18 is a diagram of an electronic system 1000 including a semiconductor device 1100 according to example embodiments.

Referring to FIG. 18, the electronic system 1000 according to the example embodiment may include the semiconductor device 1100 and a controller 1200 electrically connected to the semiconductor device 1100. The electronic system 1000 may be a storage device including at least one semiconductor device 1100 or an electronic device including the storage device. For example, the electronic system 1000 may include a solid-state drive (SSD) device, a universal serial bus (USB), a computing system, a medical device, or a communication device, which includes at least one semiconductor device 1100.

The semiconductor device 1100 may be a non-volatile memory device. For example, the semiconductor device

1100 may be a NAND flash memory device including at least one of the structures of the semiconductor devices 100, 200, 300, 400, and 500, which have been described with reference to FIGS. 1 to 10. The semiconductor device 1100 may include a first structure 1100F and a second structure 1100S on the first structure 1100F. In example embodiments, the first structure 1100F may beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors (e.g., LT1 and LT2) and the number of upper transistors (e.g., UT1 and UT2) may be variously changed according to embodiments.

In example embodiments, the upper transistors UT1 and UT2 may include a string selection transistor, and the lower transistors LT1 and LT2 may include a ground selection transistor. The first and second gate lower lines LL1 and LL2 may be respectively gate lines of the lower transistors LT1 and LT2. The word line WL may be a gate electrode of the memory cell transistor MCT, and the first and second gate upper lines UL1 and UL2 may be gate electrodes of the upper transistors UT1 and UT2.

The common source line CSL, the plurality of gate lower lines (e.g., LL1 and LL2), the plurality of word lines WL, and a plurality of gate upper lines (e.g., UL1 and UL2) may be electrically connected to the decoder circuit 1110 through a plurality of first connecting wires 1115, which extend to the second structure 1100S in the first structure 1100F. The plurality of bit lines BL may be electrically connected to the page buffer 1120 through a plurality of second connecting wirings 1125, which extend to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an I/O pad 1101 that is electrically connected to the logic circuit 1130. The I/O pad 1101 may be electrically connected to the logic circuit 1130 through an I/O connection wiring 1135, which extends to the second structure 1100S in the first structure 1100F.

The controller 1200 may include a processor 1210, a NAND controller 1220, and a host interface (or host I/F) 1230. In some embodiments, the electronic system 1000 may include a plurality of semiconductor devices 1100. In this case, the controller 1200 may control the plurality of semiconductor devices 1100.

The processor 1210 may control all operations of the electronic system 1000 including the controller 1200. The processor 1210 may operate according to predetermined firmware and may access the semiconductor device 1100 by controlling the NAND controller 1220. The NAND controller 1220 may include a NAND interface (or NAND I/F) 1221 configured to process communication with the semiconductor device 1100. A control command for controlling the semiconductor device 1100, data to be written to the plurality of memory cell transistors MCT of the semiconductor device 1100, and data to be read from the plurality of memory cell transistors MCT of the semiconductor device 1100 may be transmitted through the NAND interface 1221. The host interface 1230 may provide a communication function between the electronic system 1000 and an external host. When receiving the control command from the external host through the host interface 1230, the processor 1210 may control the semiconductor device 1100 in response to the control command.

Figure 19:
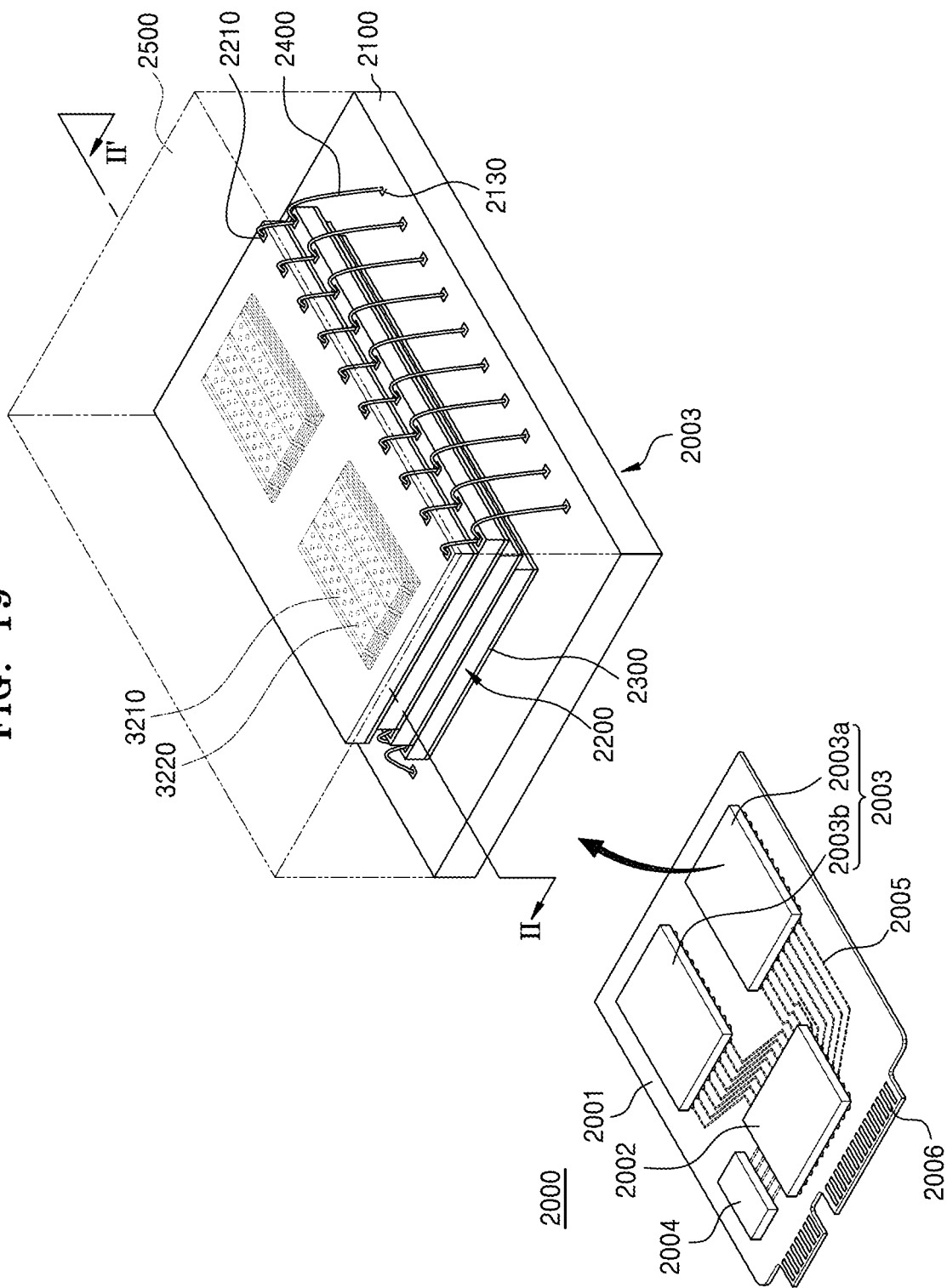
FIG. 19 is a perspective view of an electronic system 2000 including a semiconductor device, according to example embodiments.

FIG. 19 is a perspective view of an electronic system 2000 including a semiconductor device, according to example embodiments.

Referring to FIG. 19, the electronic system 2000 according to the example embodiments may include a main substrate 2001, a controller 2002 mounted on the main substrate 2001, at least one semiconductor package 2003, and DRAM 2004. The semiconductor package 2003 and the DRAM 2004 may be connected to the controller 2002 by a plurality of wiring patterns 2005 formed in the main substrate 2001.

The main substrate 2001 may include a connector 2006 including a plurality of pins that are combined with an external host. In the connector 2006, the number and arrangement of pins may depend on a communication interface between the electronic system 2000 and the external host. In example embodiments, the electronic system 2000 may communicate with the external host by using any one of interfaces, such as a USB, peripheral component interconnect-express (PCI-E), serial advanced technology attachment (SATA), and M-Phy for universal flash storage (UFS). In example embodiments, the electronic system 2000 may operate by power received from the external host through the connector 2006. The electronic system 2000 may further include a power management integrated circuit (PMIC) configured to divide power supplied from the external host into the controller 2002 and the semiconductor package 2003.

The controller 2002 may write data to the semiconductor package 2003 or read data from the semiconductor package 2003 and improve an operating speed of the electronic system 2000.

The DRAM 2004 may be a buffer memory configured to reduce a speed difference between the semiconductor package 2003, which is a data storage space, and the external host. The DRAM 2004 included in the electronic system 2000 may operate as a kind of cache memory and provide a space for temporarily storing data in a control operation on the semiconductor package 2003. When the electronic system 2000 includes the DRAM 2004, the controller 2002 may further include a DRAM controller configured to control the DRAM 2004 in addition to a NAND controller configured to control the semiconductor package 2003.

The semiconductor package 2003 may include first and second semiconductor packages 2003a and 2003b, which are apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the plurality of semiconductor chips 2200 on the substrate 2100, an adhesive layer 2300 on a lower surface of each of the plurality of semiconductor chips 2200, a connection structure 2400 configured to electrically connect the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board (PCB) including a plurality of package upper pads 2130. Each of the plurality of semiconductor chips 2200 may include an I/O pad 2210. The I/O pad 2210 may correspond to the I/O pad 1101 of FIG. 18. Each of the plurality of semiconductor chips 2200 may include a plurality of gate stacks 3210 and a plurality of channel structures 3220. Each of the plurality of semiconductor chips 2200 may include at least one of the semiconductor devices 100, 200, 300, 400, and 500 that have been described with reference to FIGS. 1 to 10.

In example embodiments, the connection structure 2400 may be a bonding wire configured to electrically connect the I/O pad 2210 to the package upper pad 2130. Accordingly, in the first and second semiconductor packages 2003a and 2003b, the plurality of semiconductor chips 2200 may be electrically connected to each other using a bonding wire technique and electrically connected to the package upper pad 2130 of the package substrate 2100. In example embodiments, in the first and second semiconductor packages 2003a and 2003b, the plurality of semiconductor chips 2200 may be electrically connected to each other by connection structures including through electrodes (e.g., through silicon vias (TSVs)) instead of the connection structure 2400 for a bonding wire technique.

In example embodiments, the controller 2002 and the plurality of semiconductor chips 2200 may be included in one package. In example embodiments, the controller 2002 and the plurality of semiconductor chips 2200 may be mounted on an additional interposer substrate, which is different from the main substrate 2001, and the controller 2002 may be connected to the plurality of semiconductor chips 2200 by wirings formed on the interposer substrate.

Figure 20:
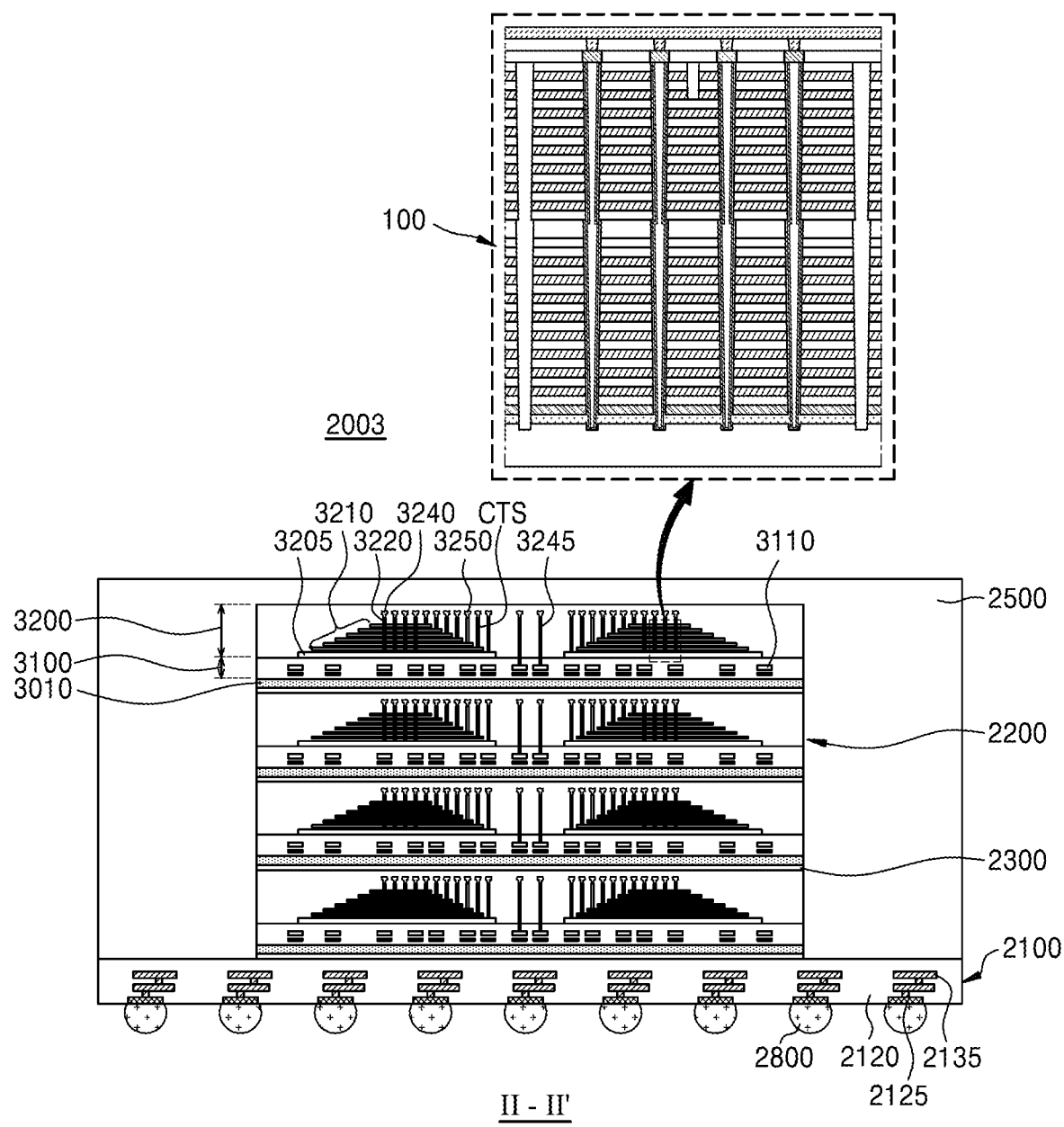
FIG. 20 is a cross-sectional view of semiconductor packages according to example embodiments.

FIG. 20 is a cross-sectional view of semiconductor packages according to example embodiments. FIG. 20 illustrates a detailed configuration taken along line II-II' of FIG. 19.

Referring to FIG. 20, in a semiconductor package 2003, a package substrate 2100 may be a printed circuit board (PCB). The package substrate 2100 may include a package substrate body 2120, a plurality of package upper pads 2130 (refer to FIG. 19) on a top surface of the package substrate body 2120, a plurality of lower pads 2125 on a bottom surface of the package substrate body 2120 or exposed through the bottom surface thereof, and a plurality of internal wirings 2135 configured to electrically connect the plurality of upper pads 2130 to the plurality of lower pads 2125 in the package substrate body 2120. The plurality of upper pads 2130 may be electrically connected to a plurality of connection structures 2400. The plurality of lower pads 2125 may be connected to a plurality of wiring patterns 2005, which are on the main substrate 2001 of the electronic system 2000 shown in FIG. 19, through a plurality of conductive connectors 2800.

Each of a plurality of semiconductor chips 2200 may include a semiconductor substrate 3010 and a first structure 3100 and a second structure 3200, which are sequentially stacked on the semiconductor substrate 3010. The first structure 3100 may include a peripheral circuit region including a plurality of peripheral wirings 3110. The second structure 3200 may include a common source line 3205, a gate stack 3210 on the common source line 3205, a channel structure 3220 passing through the gate stack 3210, a bit line 3240 electrically connected to the channel structure 3220, and gate connection wiring 3250 electrically connected to a word line (refer to WL in FIG. 18) included in the gate stack 3210 through a contact CTS. In example embodiments, each of the plurality of semiconductor chips 2200 may include the same configuration as in the semiconductor devices 100, 200, 300, 400, and 500 described with reference to FIGS. 1 to 10.

Each of the plurality of semiconductor chips 2200 may include a through wiring 3245, which is electrically connected to the plurality of peripheral wirings 3110 of the first structure 3100 and extends into the second structure 3200. The through wiring 3245 may be outside the gate stack 3210. In other example embodiments, the semiconductor package 2003 may further include a through wiring passing through the gate stack 3210. Each of the plurality of semiconductor chips 2200 may further include an I/O pad (refer to 2210 in FIG. 19), which is electrically connected to the plurality of peripheral wirings 3110 of the first structure 3100.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
   forming a structure by alternately stacking a plurality of first films and a plurality of second films on a substrate;
   forming a vertical hole extending vertically through the structure;
   forming a carbon-containing barrier film on an inner sidewall of the vertical hole such that the carbon-containing barrier film is in contact with portions of the plurality of first films and the plurality of second films;
   forming a sacrificial metal film on the carbon-containing barrier film in the vertical hole;
   exposing the carbon-containing barrier film by removing the sacrificial metal film; and
   removing the carbon-containing barrier film with an ashing process.

2. The method of claim 1, wherein the carbon-containing barrier film comprises carbon atoms and nitrogen atoms.

3. The method of claim 1, wherein the carbon-containing barrier film comprises a boron carbonitride (BCN) thin film.

4. The method of claim 1, wherein a content of carbon atoms in the carbon-containing barrier film is at least 30 atomic percent (at %).

5. The method of claim 1, further comprising after the removing the carbon-containing barrier film, forming a plug structure in the vertical hole,
   wherein the plug structure comprises a selected one of a channel structure, a memory cell contact, and a through electrode.

6. The method of claim 1, wherein each of the plurality of first films comprises a silicon oxide film, and each of the plurality of second films comprises a silicon nitride film.

7. The method of claim 1, wherein the carbon-containing barrier film has a hexagonal BCN (h-BCN) structure in which carbon atoms, boron atoms, and nitrogen atoms are regularly arranged.

8. A method of manufacturing a semiconductor device, the method comprising:
   providing a substrate, the substrate having a first region having a plurality of chips thereon and a second region surrounding the first region;
   forming a first structure by alternately stacking a plurality of first films and a plurality of second films in the first region on the substrate, and forming a second structure in the second region on the substrate;

forming a vertical hole extending vertically through the first structure in the first region, and forming a recess region and a key hole in the second structure in the second region;

forming a carbon-containing barrier film comprising a first portion and a second portion, wherein the first portion is on an inner sidewall of the vertical hole and in contact with portions of the plurality of first films and the plurality of second films in the first region, and the second portion is on an inner surface of the recess region in the second region;

simultaneously forming a sacrificial metal film and an alignment metal film, wherein the sacrificial metal film is in the vertical hole on the first portion of the carbon-containing barrier film in the first region, and the alignment metal film is on the second portion of the carbon-containing barrier film in the second region;

exposing the first portion of the carbon-containing barrier film by removing the sacrificial metal film from the first region; and removing the first portion of the carbon-containing barrier film from the first region with an ashing process.

9. The method of claim 8, wherein each of the first portion and the second portion of the carbon-containing barrier film comprises carbon atoms and nitrogen atoms.

10. The method of claim 8, wherein each of the first portion and the second portion of the carbon-containing barrier film comprises a boron carbonitride (BCN) thin film.

11. The method of claim 8, wherein a content of carbon atoms in each of the first portion and the second portion of the carbon-containing barrier film is at least 30 at %.

12. The method of claim 8, further comprising, after the removing of the first portion of the carbon-containing barrier film, forming a plug structure inside the vertical hole in the first region, wherein the plug structure comprises a selected one of a channel structure, a memory cell contact, and a through electrode.

13. The method of claim 8, wherein each of the plurality of first films comprises a silicon oxide film, and each of the plurality of second films comprises a silicon nitride film.

14. The method of claim 8, wherein the sacrificial metal film is in contact with the first portion of the carbon-containing barrier film inside the vertical hole in the first region, the alignment metal film is in contact with the second portion of the carbon-containing barrier film inside the recess region in the second region, and each of the sacrificial metal film and the alignment metal film comprises tungsten.

15. A method of manufacturing a semiconductor device, the method comprising:

forming a lower structure by alternately stacking a plurality of silicon oxide films and a plurality of sacrificial insulating films in a chip region on a substrate;

forming a lower vertical hole that extends vertically through the lower structure;

forming a first carbon-containing barrier film on an inner sidewall of the lower vertical hole such that the first carbon-containing barrier film is in contact with portions of the plurality of silicon oxide films and the plurality of sacrificial insulating films;

forming a sacrificial metal film contacting the first carbon-containing barrier film in the lower vertical hole on the first carbon-containing barrier film;

forming a second carbon-containing barrier film in an entrance space of the lower vertical hole on the first carbon-containing barrier film and the sacrificial metal film;

forming an upper structure on the lower structure, the upper structure having an upper vertical hole exposing the second carbon-containing barrier film;

removing the second carbon-containing barrier film through the upper vertical hole with an ashing process;

exposing the first carbon-containing barrier film by removing the sacrificial metal film through the upper vertical hole;

removing the first carbon-containing barrier film through the upper vertical hole with an ashing process;

forming a channel structure inside the lower vertical hole and the upper vertical hole; and replacing the plurality of sacrificial insulating films with a plurality of gate lines.

16. The method of claim 15, wherein each of the first and second carbon-containing barrier films each comprises a boron carbonitride (BCN) thin film.

17. The method of claim 15, wherein a content of carbon atoms in each of the first and second carbon-containing barrier films is at least 30 at %.

18. The method of claim 15, wherein each of the plurality of sacrificial insulating films comprises a silicon nitride film.

19. The method of claim 15, wherein the sacrificial metal film comprises tungsten.

20. The method of claim 15, further comprising:

forming an insulating structure, wherein a recess region and a key hole are formed in a top surface of the insulating structure in a scribe lane region, which is apart from the chip region in a lateral direction on the substrate;

forming an alignment barrier film simultaneously with the forming of the first carbon-containing barrier film, wherein the alignment barrier film is on an inner surface of the recess region and the key hole in the scribe lane region and comprises a same material as the first carbon-containing barrier film; and forming an alignment metal film simultaneously with the forming of the sacrificial metal film, wherein the alignment metal film contacts the alignment barrier film inside each of the recess region and the key hole in the scribe lane region and comprises a same material as the sacrificial metal film.

* * * * *